US009550322B2

(12) United States Patent
Shida et al.

(10) Patent No.: US 9,550,322 B2
(45) Date of Patent: Jan. 24, 2017

(54) NEAR-FIELD EXPOSURE MASK, RESIST PATTERN FORMING METHOD, DEVICE MANUFACTURING METHOD, NEAR-FIELD EXPOSURE METHOD, PATTERN FORMING METHOD, NEAR-FIELD OPTICAL LITHOGRAPHY MEMBER, AND NEAR-FIELD NANOIMPRINT METHOD

(71) Applicant: KABUSHIKI KAISHA TOSHIBA, Tokyo (JP)

(72) Inventors: Naomi Shida, Tokyo (JP); Kenji Todori, Yokohama (JP); Shigehiko Mori, Kawasaki (JP); Ko Yamada, Yokohama (JP); Masakazu Yamagiwa, Tokyo (JP); Reiko Yoshimura, Kawasaki (JP); Yasuyuki Hotta, Tokyo (JP); Tsukasa Tada, Tokyo (JP); Hiroyuki Kashiwagi, Fujisawa (JP); Ikuo Yoneda, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 96 days.

(21) Appl. No.: 14/683,794

(22) Filed: Apr. 10, 2015

(65) Prior Publication Data

US 2015/0246478 A1 Sep. 3, 2015

Related U.S. Application Data

(62) Division of application No. 13/413,163, filed on Mar. 6, 2012, now Pat. No. 9,029,047.

(30) Foreign Application Priority Data

Mar. 9, 2011 (JP) .................................. 2011-51698

(51) Int. Cl.
*G03F 7/24* (2006.01)
*G03F 7/20* (2006.01)
(Continued)

(52) U.S. Cl.
CPC ........... *B29C 59/16* (2013.01); *B29D 11/0074* (2013.01); *B82Y 10/00* (2013.01); *B82Y 30/00* (2013.01);
(Continued)

(58) Field of Classification Search
CPC ................ G03F 7/20; G03F 7/24; G03F 1/14; G03F 1/50; G03B 7/02; G03B 7/14
See application file for complete search history.

(56) References Cited

U.S. PATENT DOCUMENTS 7,922,960 B2 * 4/2011 Hiroshima ............. B82Y 10/00 264/496
7,968,256 B2 6/2011 Ito et al.
(Continued)

FOREIGN PATENT DOCUMENTS

JP 2003-7599 A 1/2003
JP 2004-235574 8/2004
(Continued)

OTHER PUBLICATIONS

Office Action issued Oct. 2, 2015 in Japanese Patent Application No. 2011-51698 (with English language translation).
(Continued)

*Primary Examiner* — Stephen Rosasco
(74) *Attorney, Agent, or Firm* — Oblon, McClelland, Maier & Neustadt, L.L.P.

(57) ABSTRACT

A near-field exposure mask according to an embodiment includes: a silicon substrate; and a near-field light generating unit that is formed on the silicon substrate, the near-field light generating unit being a layer containing at least one
(Continued)

element selected from the group consisting of Au, Al, Ag, Cu, Cr, Sb, W, Ni, In, Ge, Sn, Pb, Zn, Pd, and C, or a film stack formed with layers made of some of those materials.

10 Claims, 23 Drawing Sheets

(51) Int. Cl.

| | |
|---|---|
| ***G03F 1/50*** | (2012.01) |
| ***B29C 59/16*** | (2006.01) |
| ***B82Y 30/00*** | (2011.01) |
| ***B82Y 40/00*** | (2011.01) |
| ***B82Y 10/00*** | (2011.01) |
| ***B29D 11/00*** | (2006.01) |
| *G03F 7/00* | (2006.01) |
| *B29L 11/00* | (2006.01) |

(52) U.S. Cl.

CPC ........... *B82Y 40/00* (2013.01); *G03F 7/70325* (2013.01); *B29L 2011/00* (2013.01); *G03F 1/50* (2013.01); *G03F 7/0002* (2013.01)

(56) References Cited

U.S. PATENT DOCUMENTS

| | | | |
|---|---|---|---|
| 8,134,894 | B2 | 3/2012 | Kitazawa et al. |
| 2004/0166421 | A1 | 8/2004 | Yamaguchi et al. |

FOREIGN PATENT DOCUMENTS

| | | |
|---|---|---|
| JP | 2005-64099 | 3/2005 |
| JP | 2005-303197 | 10/2005 |
| JP | 2006-287012 | 10/2006 |
| JP | 2007-17961 | 1/2007 |
| JP | 2008-112142 | 5/2008 |
| JP | 2008-299890 | 12/2008 |
| JP | 2010-50431 | 3/2010 |
| JP | 2010-287625 | 12/2010 |

OTHER PUBLICATIONS

Office Action issued Jan. 19, 2016 in Japanese Patent Application No. 2014-203371 (with English language translation downloaded from Global Dossier at 3:31 PM JST on Feb. 17, 2016; Last updated Feb. 2, 2016).

Office Action issued Jan. 15, 2016 in Japanese Patent Application No. 2011-51698 (with English language translation).

Office Action issued Jun. 19, 2015 in Japanese Patent Application No. 2014-203371 (with English language translation).

Office Action issued Mar. 12, 2013 in Japanese Patent Application No. 2011-51698 (with English translation).

Japanese Office Action issued Nov. 5, 2013, in Japan Patent Application No. 2011-051698 (with English translation).

Office Action issued Jul. 1, 2014, in Japanese Patent Application No. 2011-051698 with English translation.

* cited by examiner 67
64a
62

67a
62
61A 62
67a
54
52
61A 64
62

64a
64b
62

61B
70
62
66a
54
52
68
54a
54b 72
62
66a
61C
54
52

72
62
66a
61C
54
52

72
62
66a
61C
54
52

68
72
62
66a
61C
54
52
54a 54b
52

90
92
94
82
80

82
80

80

90
92
94
82
80

90
92
94
82
80

| | TEMPLATE MATERIAL | SUBSTRATE MATERIAL | INJECTION LIGHT SOURCE | LIGHT IRRADIATION SIDE | CURING WAVELENGTH OF LIGHT -CURABLE RESIN | MARGIN OF RESIN SELECTION | CONTACT PROPERTIES | NEAR-FIELD GENERATION EFFICIENCY |
|---|---|---|---|---|---|---|---|---|
| EXAMPLE 1 | GLASS | Si | 1 μm–5 μm | SUBSTRATE SIDE | NOT CURABLE WITH LIGHT OF 1 TO 5 μm | ○ | ○ | ◎ |
| EXAMPLE 2 | GLASS | Si | 1 μm–5 μm | STAMPER SIDE | NOT CURABLE WITH LIGHT OF 1 TO 5 μm | ○ | ○ | △ |
| EXAMPLE 3 | GLASS | GLASS | 1 μm–5 μm | SUBSTRATE SIDE | NOT CURABLE WITH LIGHT OF 1 TO 5 μm | ○ | △ | ◎ |
| EXAMPLE 4 | GLASS | GLASS | 1 μm–5 μm | STAMPER SIDE | NOT CURABLE WITH LIGHT OF 1 TO 5 μm | ○ | △ | △ |
| EXAMPLE 5 | Si | GLASS | 1 μm–5 μm | SUBSTRATE SIDE | NOT CURABLE WITH LIGHT OF 1 TO 5 μm | ○ | ○ | ◎ |
| EXAMPLE 6 | Si | GLASS | 1 μm–5 μm | STAMPER SIDE | NOT CURABLE WITH LIGHT OF 1 TO 5 μm | ○ | ○ | △ |
| EXAMPLE 7 | Si | Si | 1 μm–5 μm | SUBSTRATE SIDE | NOT CURABLE WITH LIGHT OF 1 TO 5 μm | ○ | ◎ | ◎ |
| EXAMPLE 8 | Si | Si | 1 μm–5 μm | STAMPER SIDE | NOT CURABLE WITH LIGHT OF 1 TO 5 μm | ○ | ◎ | △ |

Fig. 19

| | TEMPLATE MATERIAL | SUBSTRATE MATERIAL | INJECTION LIGHT SOURCE | LIGHT IRRADIATION SIDE | CURING WAVELENGTH OF LIGHT -CURABLE RESIN | MARGIN OF RESIN SELECTION | CONTACT PROPERTIES | NEAR-FIELD GENERATION EFFICIENCY |
|---|---|---|---|---|---|---|---|---|
| COMPARATIVE EXAMPLE 1 | GLASS | Si | ULTRAVIOLET LIGHT AND VISIBLE LIGHT | STAMPER SIDE | NOT CURABLE WITH ULTRAVIOLET LIGHT AND VISIBLE LIGHT | △ | ○ | △ |
| COMPARATIVE EXAMPLE 2 | GLASS | GLASS | ULTRAVIOLET LIGHT AND VISIBLE LIGHT | SUBSTRATE SIDE | NOT CURABLE WITH ULTRAVIOLET LIGHT AND VISIBLE LIGHT | △ | △ | ◎ |
| COMPARATIVE EXAMPLE 3 | GLASS | GLASS | ULTRAVIOLET LIGHT AND VISIBLE LIGHT | STAMPER SIDE | NOT CURABLE WITH ULTRAVIOLET LIGHT AND VISIBLE LIGHT | △ | △ | △ |
| COMPARATIVE EXAMPLE 4 | Si | GLASS | ULTRAVIOLET LIGHT AND VISIBLE LIGHT | SUBSTRATE SIDE | NOT CURABLE WITH ULTRAVIOLET LIGHT AND VISIBLE LIGHT | △ | ○ | ◎ |

Fig. 20

VAPOR DEPOSITION, SPUTTERING, MBE, OR THE LIKE FROM DIAGONALLY LEFT

VAPOR DEPOSITION, SPUTTERING, MBE, OR THE LIKE FROM DIAGONALLY RIGHT

NEAR-FIELD EXPOSURE MASK, RESIST PATTERN FORMING METHOD, DEVICE MANUFACTURING METHOD, NEAR-FIELD EXPOSURE METHOD, PATTERN FORMING METHOD, NEAR-FIELD OPTICAL LITHOGRAPHY MEMBER, AND NEAR-FIELD NANOIMPRINT METHOD

CROSS-REFERENCE TO RELATED APPLICATION

This application is a Divisional of U.S. application Ser. No. 13/413,163, filed on Mar. 6, 2012, which is based upon and claims the benefit of priority from prior Japanese Patent Application No. 2011-51698 filed on Mar. 9, 2011 in Japan, the entire contents of which are incorporated herein by reference.

FIELD

Embodiments described herein relate generally to a near-field exposure mask, a resist pattern forming method, a device manufacturing method, a near-field exposure method, a pattern forming method, a near-field optical lithography member, and a near-field nanoimprint method.

BACKGROUND

In recent years, there have been increasing demands for devices with higher densities and higher integration degrees in the fields of various electronic devices that require fine processing, such as semiconductor devices. To satisfy those demands, formation of finer patterns is essential. In procedures for manufacturing such semiconductor devices, the photolithography technology plays an important role in the formation of fine patterns.

To increase photolithography resolution, it is necessary to shorten the wavelength of the light source to be used for exposures or increase the numerical aperture of the projector lens. When the numerical aperture is increased, the resolution becomes higher, but the focal depth becomes smaller. As a result, predetermined resolution cannot be achieved with respect to an exposure of a surface having concavities and convexities with a depth equal to or greater than the focal depth. Therefore, the flatness of the substrate needs to be increased. To form even finer patterns, the wavelength $\lambda$, of each light source is required to have a shorter wavelength. The wavelength $\lambda$, of each light source used for exposures has been shortened from g-ray (436 nm) to i-ray (365 nm). At present, excimer lasers (248 nm, 193 nm) are being mainly used as the light sources. By the photolithography technology, however, the diffraction limit of a light source is the resolution limit. Therefore, even with the use of a 193-nm ArF excimer laser immersion exposure technique, it is difficult to form patterns of 10 nm or smaller in linewidth.

To form even finer patterns, it is necessary to use the X-ray lithography technology or the electron beam lithography technology. By the X-ray lithography technology, the resolution can be made ten or more times as high as the resolution achieved when an exposure is performed with the use of an excimer laser. By the X-ray lithography technology, however, it is difficult to form a mask, and the device costs are high.

By the electron beam lithography technology, formation of patterns on the order of nanometers can be controlled with high precision, and a greater focal depth than that of an optical system can be achieved. The electron beam lithography has the advantage that a pattern can be drawn directly on a wafer without a mask. However, the electron beam lithography has low throughput, and is costly. Therefore, the electron beam lithography is not suited to mass production.

Further, in lithography using an X-ray or an electron beam, it is necessary to develop a resist in accordance with each exposure method, and there are a large number of problems in terms of sensitivity, resolution, etching endurance, and the like.

To solve those problems, there has been a suggested method in which by near-field light leaking from openings with diameters sufficiently smaller than the wavelength of the light to be emitted, a resist is then exposed and developed, to form a fine pattern. This method is characterized by achieving a spatial resolving power on the order of nanometers, regardless of the wavelength of the light source. The method using near-field light is not subjected to a restriction in terms of the optical diffraction limit, and accordingly, is capable of achieving a spatial resolving power that is a third or less of the light source wavelength. Further, with the use of a mercury lamp or a semiconductor laser as the light source, the size of the light source can be reduced. Accordingly, the device can be made smaller in size, and the costs can be lowered.

As one of the lithography techniques using near-field light, there has been a known method by which a near-field exposure mask having a light shielding layer with openings smaller than the light source wavelength is brought into contact with a resist so that the distance in between becomes 100 nm or less, which is a near-field range, and the fine pattern on the mask is transferred to the resist by a collective exposure. In this operation, the contact properties are critical. It is known that a membrane mask can be used as the near-field exposure mask. It is also known that a resin mask can be used as the near-field exposure mask.

As a method of performing an exposure through contact with the use of a membrane mask, there has been a disclosed near-field exposure method by which the thickness of the mask is reduced to such a value that the mask can be elastically deformed, and the mask is elastically deformed by applying a controlled pressure onto the thinned portion so that the exposure mask is brought into contact with the substrate to be exposed. By this method, however, the required manufacturing process consists of a large number of procedures for forming the mask having a thin-film structure, and the thinner portion of the mask might be broken at the time of pressure application or pressure release.

By a method of performing an exposure with the use of a resin mask, on the other hand, the contact between the mask and the light shielding layer is strong. Therefore, the mask might be broken at the time of mask detachment, or the resist might come off the substrate.

When a resist such as a chemically-amplified resist or a photo cation polymerizable resist that exhibits a development contrast through a reaction with a catalyst that is the acid generated by an exposure, the light shielding layer to be the mask is corroded by the generated acid. As a result, the life of the mask might be shortened.

As described above, conventional near-field masks have room for improvement to achieve excellent contact properties with respect to to-be-exposed substrate over a large area, reduce the number of procedures in the manufacturing process, and increase the durability.

There has been a known method by which a near-field exposure is performed by using resonant light with a light wavelength equivalent to the resonant energy of the molecules forming a resist. The near-field exposure using resonant light is performed as follows.

A first substrate having a photoresist layer formed thereon, and a mask having a mask pattern formed on a transparent second substrate are prepared. The mask pattern is then brought into contact with the resist layer. With the mask being in contact with the photoresist layer, an i-ray (365 nm) is emitted onto the back surface of the mask. As a result, near-field light leaks from the openings of the mask pattern by virtue of the i-ray irradiation, and an exposure is performed. The exposed resist portions react to the light.

After the exposure, the mask is detached from the photoresist layer, and the photoresist layer is developed with a developer. As a result, the exposed portions are dissolved, and a pattern is formed.

As another near-field exposure method, there has been a known method by which a near-field exposure is performed by using nonresonant light with a longer wavelength than the wavelength of light equivalent to the resonant energy of the molecules forming a resist. A mask pattern transfer through a near-field exposure using such a nonresonant wavelength is performed as follows. A resist layer is formed on a first substrate, and a mask having a mask pattern with openings formed on a transparent second substrate is prepared. The mask pattern is then brought into contact with the resist layer. With the mask pattern being in contact with the resist layer, nonresonant light having a longer wavelength than the wavelength of light equivalent to the resonant energy of the molecules forming the resist is emitted on to the back surface of the mask.

As a result, near-field light leaks from the openings of the mask pattern by virtue of the nonresonant light irradiation, but the resist layer does not react to the nonresonant light. However, strong electronic polarization occurs at the edge portions of the mask pattern, and near-field light is generated from the nonresonant light. The molecules forming the resist get dissociated through excitation caused by multiple light absorptions by the near field light generated from the nonresonant light (a multistep transition process).

After the exposure, the mask is detached from the resist layer, and the resist layer is developed with a developer. As a result, the portions exposed by the near-field light generated from the nonresonant light are dissolved, and a pattern is formed. The difference from an exposure using resonant light is that a pattern is formed along the edge portions of the mask pattern. Accordingly, a finer pattern can be formed with the use of nonresonant light.

Since the photosensitive wavelength of the photoresist is in a visible range, a glass material is normally used as the transparent second substrate. To increase the efficiency in the exposure process, the size of the transparent second substrate needs to be made larger. In recent years, the sizes of wafers used in semiconductor manufacturing processes are 300 mm in diameter. Since the near-field exposure method using nonresonant light is a contact exposure method, the size of the transparent second substrate needs to be approximately 300 mm in diameter. Since the mask pattern and the resist layer need to be in contact with each other, the transparent second substrate should have low surface roughness and small warpage.

However, where a glass material of approximately 300 mm in diameter is used as the transparent second substrate, it is difficult for the second substrate to have sufficiently low surface roughness and small warpage over a large area. On the other hand, a Si wafer of 300 mm in diameter can have sufficiently low surface roughness and small warpage. However, such a Si wafer cannot be used as the mask, because visible light cannot pass through Si.

Further, at the time of an exposure, light from the light source enters perpendicularly to the first substrate. When the transparent second substrate is made of glass, the reflectivity at the interface between the air and the glass is 4%, and the loss of the incident light energy is small. However, the reflectivity at the interface between the air and Si is as high as 30%, and the exposure time becomes longer. Therefore, the productivity becomes lower in the exposure process.

Further, there has been a demand for higher-density microfabrication of semiconductor packages, interposers, printed circuit boards, and the like, as semiconductors have been made to have smaller sizes, higher densities, and higher speeds. Particularly, in recent years, at the time of formation of a storage media fine structure pattern or formation of a biochip nanostructure, high-density microfabrication is more and more strongly required. As a mass-production means to satisfy such a technical demand, the nanoimprint technology has been studied in recent years.

The nanoimprint technology has been developed by applying a pressing method using a metal mold to the nanoscale technology, and involves a nanoscale mold processing technique for performing molding by pressing a mold with minute concavities and convexities against an object to be processed. By the nanoimprint technology, patterns with a width of several tens of nanometers can be formed. Compared with an equivalent processing technology using an electron beam, the nanoimprint technology has the advantage that a large number of patterns can be molded at very low costs.

In the nanoimprint technology, the use of near-field light has been suggested. Particularly, an ultrafine pattern of 10 nm or smaller can be transferred with high precision by the nanoimprint technology using near-field light. When a Si substrate is processed, light needs to be emitted onto a glass template. However, this irradiation direction lowers the near-field light generation efficiency.

The use of near-field light has also been suggested for template and pattern forming methods based on the nanoimprint technology. However, when a fine pattern is transferred, the contact between the template and the Si substrate needs to be improved. Therefore, there is still room for improvement to develop an optimum pattern forming method.

The present invention has been made in view of these circumstances, and an object thereof is to provide a near-field exposure mask that can secure contact between a mask and a to-be-exposed object over a large area, a resist pattern forming method, and a device manufacturing method.

Another object of the present invention is to provide a near-field exposure method by which the exposure time can be shortened.

Yet another object of the present invention is to provide a pattern forming method by which an ultrafine pattern can be transferred onto a Si substrate with high precision.

Still another object of the present invention is to provide a high-precision near-field optical lithography technique that can realize double patterning with high efficiency.

BRIEF DESCRIPTION OF THE DRAWINGS

FIG. 19 is a table showing examples of the eleventh embodiment;

FIG. 20 is a table showing comparative examples of the eleventh embodiment;

DETAILED DESCRIPTION

A near-field exposure mask according to an embodiment includes: a silicon substrate; and a near-field light generating unit formed on the silicon substrate, the near-field light generating unit being a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

The following is a description of embodiments, with references to the accompanying drawings.

First Embodiment

Referring to FIGS. 1A through 1F, a near-field exposure mask according to a first embodiment is described. FIGS. 1A through 1F are cross-sectional views illustrating the procedures for manufacturing the near-field exposure mask according to the first embodiment.

Figures 1A, 1B, 1C, 1D, 1E, 1F:
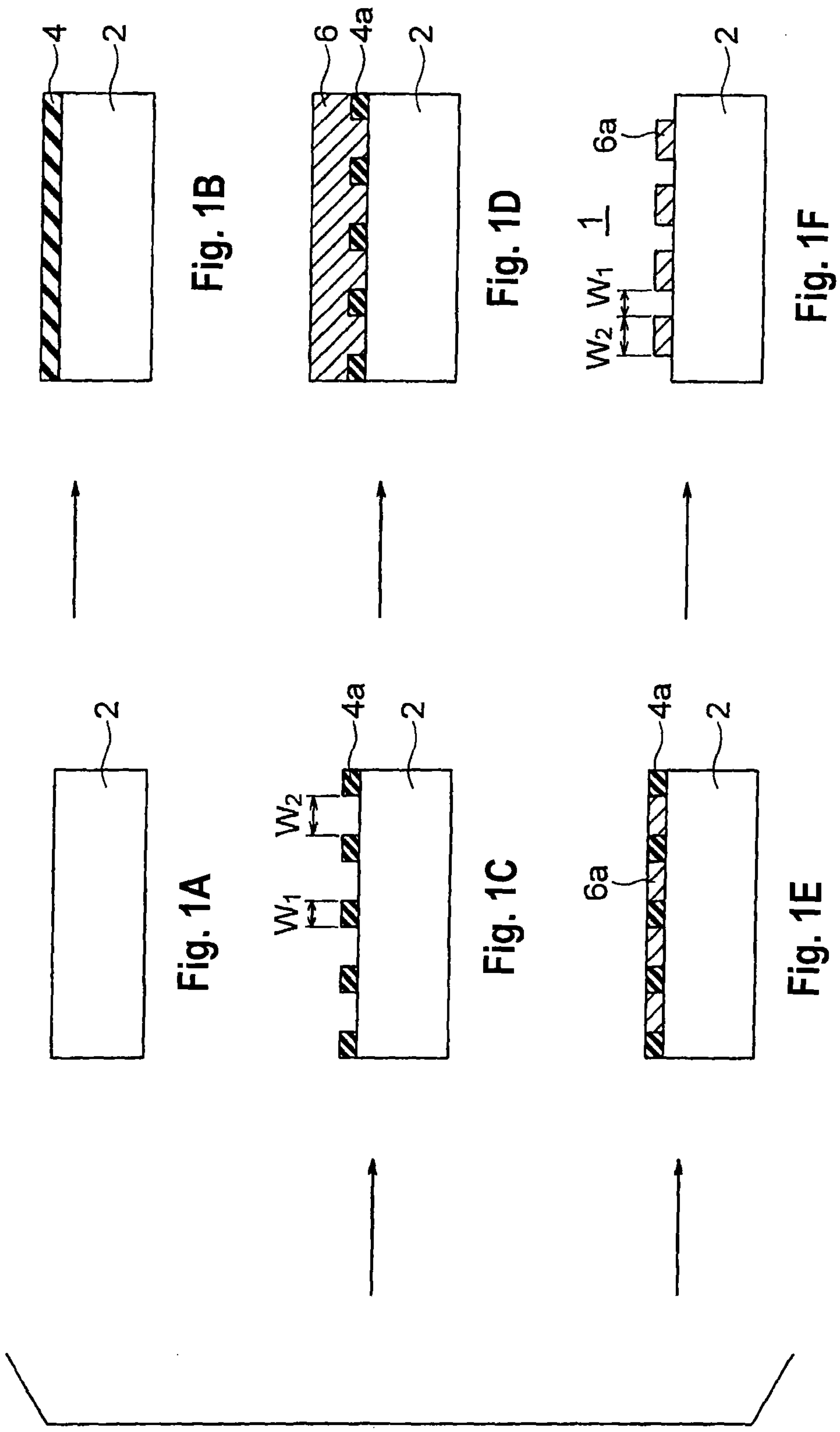
FIGS. 1A through 1F are cross-sectional views illustrating procedures for manufacturing a near-field exposure mask according to a first embodiment.

First, a silicon substrate 2 of 600 μm in thickness is prepared, and a resist layer 4 of 10 nm to 30 nm in thickness, for example, is applied onto the silicon substrate 2 (FIGS. 1A and 1B). A resist pattern 4*a* is then formed in the resist layer 4 by using an electron beam lithography technique or an Extreme Ultra-Violet (EUV) lithography technique (FIG. 1C). This resist pattern 4*a* is a line-and-space pattern in which the line width $W_1$ is 10 nm, and the space width $W_2$ is 10 nm, for example. Accordingly, the height of the resist pattern 4*a* is 10 nm to 30 nm.

After that, a near-field light generating film 6 is deposited on the resist pattern 4*a*, to fill the spaces in the resist pattern 4*a* (FIG. 1D). The near-field light generating film 6 may be a layer containing at least one element selected from the group consisting of Au, Al, Ag, Cu, Cr, Sb, W, Ni, In, Ge, Sn, Pb, Zn, Pd, and C, or a film stack formed with layers made of some of those materials.

By using Chemical Mechanical Polishing (CMP), the near-field light generating film 6 is polished, and the upper surface of the resist pattern 4*a* is exposed (FIG. 1E). After that, the resist pattern 4*a* is removed by using a resist remover, to form a near-field exposure mask 1 (FIG. 1F).

The near-field exposure mask 1 formed in this manner includes a near-field light generating film pattern 6*a* formed on the silicon substrate 2. The near-field light generating film pattern 6*a* is a line-and-space pattern in which the line width $W_2$ is 10 nm, and the space width $W_1$ is 10 nm, for example. Accordingly, the height (the thickness) of the lines in the near-field light generating film pattern 6*a* is 10 nm to 30 nm. The height (the thickness) of the lines in the near-field light generating film pattern 6*a* is 100 nm or smaller so that near-field light reaches the resist to be exposed, but is preferably 50 nm or smaller. Alternatively, the near-field light generating film pattern 6*a* may be a pattern in which the line width $W_2$ is 5 nm or greater, and the space width $W_1$ is 5 nm or greater. It should be noted that the preferred sizes in the near-field light generating film pattern 6*a* vary with devices to be formed by using the near-field exposure mask.

To secure contact between the mask 1 and the object to be exposed over a large area, the thickness of the silicon substrate 2 used as the matrix for the near-field exposure mask 1 is preferably 300 μm to 1 mm.

In this embodiment, the mask 1 is formed with the silicon substrate 2 and the near-field light generating film pattern 6*a*. Accordingly, the durability can be increased, and the mask 1 can be formed through simple manufacturing procedures.

Second Embodiment

Figure 2A:
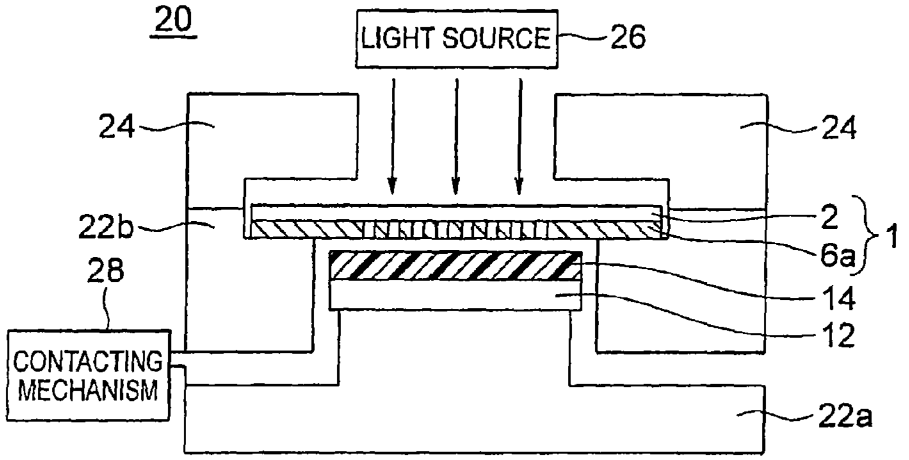
FIGS. 2A and 2B are cross-sectional views showing a near-field exposure apparatus according to a second embodiment.
Figure 2B:
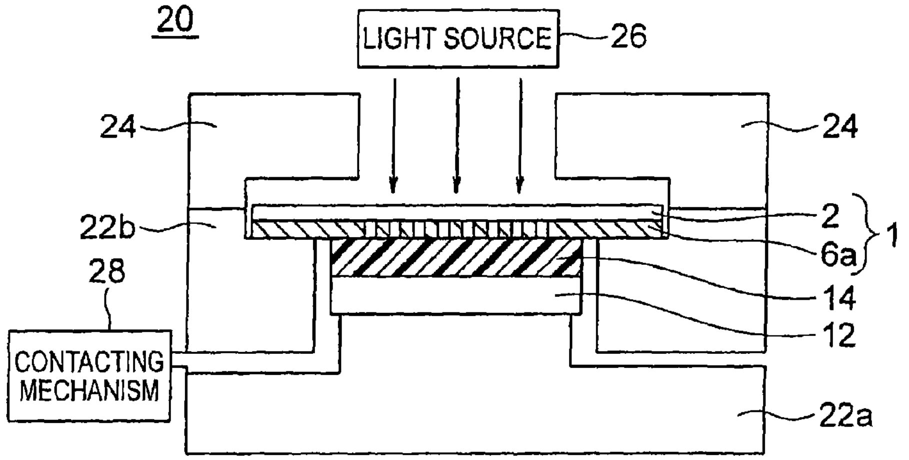

Referring now to FIGS. 2A and 2B, a near-field exposure apparatus according to a second embodiment is described. The near-field exposure apparatus 20 of the second embodiment performs exposures, using the near-field exposure mask 1 of the first embodiment. The near-field exposure apparatus 20 includes: a mount table 22*a* on which a to-be-exposed substrate (a to-be-processed substrate) 12 having a resist 14 applied thereto is placed, a supporting table 22*b* that supports the face of the near-field exposure mask 1 on which the near-field light generating film pattern 6*a* is formed; and a mask 24 to allow light from a light source 26 to irradiate the region of the near-field exposure mask 1 on which the near-field light generating film pattern 6*a* is formed. As shown in FIGS. 2A and 2B, light is emitted from the light source 26 located on the silicon substrate side of the near-field exposure mask 1, and the near-field light generating film pattern 6*a* and the resist 14 applied onto the to-be-exposed substrate 12 are positioned to face each other.

FIG. 2A is a cross-sectional view showing a situation where the near-field light generating film pattern 6*a* of the near-field exposure mask 1 is not in contact with the resist 14 applied onto the to-be-exposed substrate 12. FIG. 2B is a cross-sectional view showing a situation where the near-field light generating film pattern 6*a* of the near-field exposure mask 1 is in contact with the resist 14 applied onto the to-be-exposed substrate 12.

The near-field exposure apparatus 20 of the second embodiment includes the light source 26 used for near-field exposures, and a contacting mechanism 28 (such as a vacuum pump) for bringing the near-field light generating film pattern 6*a* of the near-field exposure mask 1 into contact with the resist 14 applied onto the to-be-exposed substrate 12.

When the near-field light generating film pattern 6*a* is not in contact with the resist 14 applied onto the to-be-exposed substrate 12 as shown in FIG. 2A, the contacting mechanism 28 does not operate, and the light source 26 is in an OFF state. On the other hand, when the near-field light generating film pattern 6*a* is in contact with the resist 14 applied onto the to-be-exposed substrate 12 as shown in FIG. 2B, the contacting mechanism 28 operates, and the light source 26 is in an ON state. That is, by activating the contact mechanism 28, the near-field light generating film pattern 6*a* is brought into contact with the resist 14. With the near-field light generating film pattern 6*a* being in contact with the resist 14, the back surface of the near-field exposure mask 1 is irradiated with the light from the light source 26. It should be noted that the light source 26 needs to be a light source that generates light of 1100 nm or longer in wavelength, because light of 1100 nm or longer in wavelength can pass through Si.

As a result, near-field light is generated from the opening portions of the near-field light generating film pattern 6*a* of the near-field exposure mask 1, and a pattern latent image is transferred to the resist 14 on the to-be-exposed substrate 12. The exposure is preferably performed where the near-field exposure mask 1 and the resist 14 formed on the to-be-exposed substrate 12 are in close contact with each other (without any non-contact region) in the area in which the pattern is to be formed. In the second embodiment, exposures are performed with light entering from the opposite side from the side on which the near-field light generating film pattern 6*a* of the near-field exposure mask 1 is formed. However, as will be described later, exposures may be performed with light entering from the side on which the near-field light generating film pattern 6*a* of the near-field exposure mask 1 is formed.

As the resist 14 used in the second embodiment, either a positive resist or a negative resist can be used. Examples of positive resists that can be used include a diazonaphthoquinone-novolac resist and a chemically-amplified positive resist. Examples of negative resists that can be used include a chemically-amplified negative resist, a photo cation polymerizable resist, a photo radical polymerizable resist, a polyhydroxystyrene-bisazide resist, a cyclized rubber-bisazide resist, and a polyvinyl cinnamate resist. With the use of a chemically-amplified positive resist and a chemically-amplified negative resist, a pattern with a low line edge roughness is formed. Accordingly, the use of a chemically-amplified positive resist or a chemically-amplified negative resist is particularly preferable in this embodiment.

In this embodiment, a known light source can be used as the near-field light source 26. For example, a laser having a wavelength of 1 μm to 20 μm can be used. One or more such light sources can be used. Since semiconductor lasers are less expensive, high-power lasers, the use of a semiconductor laser is more preferable in this embodiment.

Third Embodiment

Referring now to FIGS. 3A through 3D, a resist pattern forming method and a device manufacturing method according to a third embodiment are described.

In the third embodiment, the near-field exposure mask 1 of the first embodiment and the near-field exposure apparatus 20 of the second embodiment are used, for example.

Figures 3A, 3B, 3C, 3D:
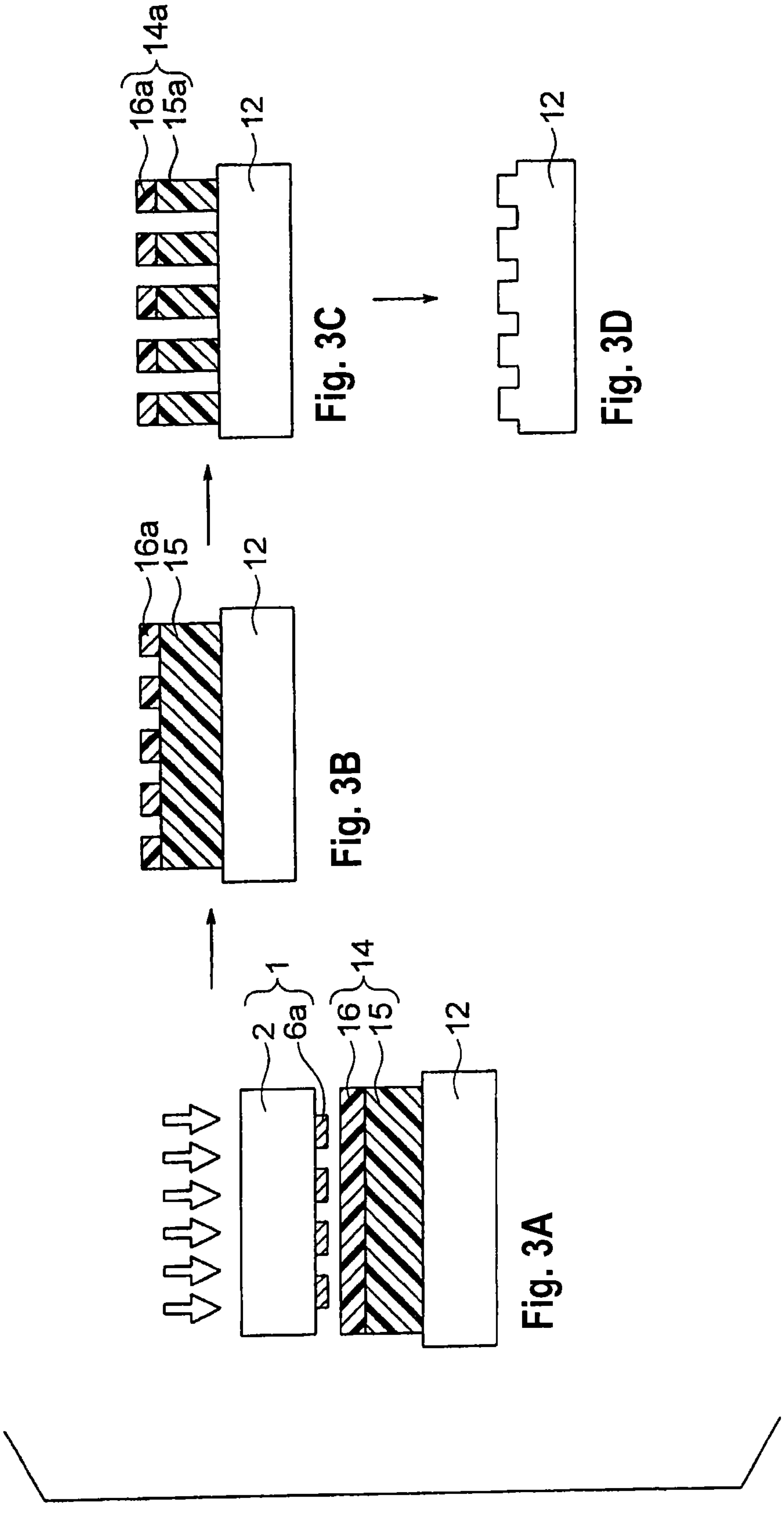
FIGS. 3A through 3D are cross-sectional views illustrating a resist pattern forming method and a device manufacturing method according to a third embodiment.

First, the to-be-processed substrate 12 is prepared, and the resist layer 14 is applied onto the to-be-processed substrate 12. The resist layer 14 may be a single layer. In this embodiment, however, the resist layer 14 is a double-layer resist structure formed by stacking a first resist layer 15 and a second resist layer 16 in this order on the to-be-processed substrate 12. After that, the to-be-processed substrate 12 and the near-field exposure mask 1 according to the first embodiment are placed and arranged on the near-field exposure apparatus (not shown) according to the second embodiment in such a manner that the near-field light generating film pattern 6*a* of the near-field exposure mask 1 faces the resist layer 14 on the to-be-processed substrate 12 (FIG. 3A). The near-field light generating film pattern 6*a* of the near-field exposure mask 1 and the resist layer 14 on the to-be-processed substrate 12 are brought into contact with each other, and a near-field exposure is performed. As a result, near-field light leaks along the edge portions of the near-field light generating film pattern 6*a*, to expose the resist layer 14. In this embodiment, the resist layer 14 is a double-layer structure. Therefore, the upper resist layer 16 is exposed with the near-field light.

The near-field exposure mask 1 is then detached from the to-be-processed substrate 12, and the exposed resist layer 16 is developed. As a result, a resist pattern 16*a* is formed on the resist layer 15, as shown in FIG. 3B. With the resist pattern 16*a* being used as a mask, patterning is performed on the resist layer 15 by using a lithography technique, to form a resist pattern 15*a* (FIG. 3C). As a result, a resist pattern 14*a* having a stack structure formed with the resist pattern 15*a* and the resist pattern 16*a* is formed on the to-be-processed substrate 12 (FIG. 3C).

With the resist pattern 14*a* being used as a mask, dry etching or wet etching are performed. After the mask is removed, a semiconductor process including metal vapor deposition, lift-off, and plating is performed on the to-be-processed substrate 12, to process the to-be-processed substrate 12. In this manner, a desired device is formed in the to-be-processed substrate 12.

As the resist layer 14 used in this embodiment, either a positive resist or a negative resist can be used, as long as it has photosensitivity to the light source to be used. Examples of positive resists that can be used include a diazonaphthoquinone-novolac resist and a chemically-amplified positive resist. Examples of negative resists that can be used include a chemically-amplified negative resist, a photo cation polymerizable resist, a photo radical polymerizable resist, a polyhydroxystyrene-bisazide resist, a cyclized rubber-bisazide resist, and a polyvinyl cinnamate resist. With the use of a chemically-amplified positive resistor and a chemically-amplified negative resist, a pattern with high linewidth accuracy is formed.

As the to-be-processed substrate 12, various kinds of substrates can be used, such as a semiconductor substrate made of Si, GaAs, InP, or the like, an insulating substrate made of glass, quartz, BN, or the like, or any of those substrates on which one or more films made of a resist, a metal, an oxide, or a nitride are formed.

The propagation depth of near-field light is normally 100 nm or less. To form the resist pattern 14*a* of 100 nm or more in height by near-field optical lithography, a resist layer having a multilayer structure is preferably used. That is, it is preferable to use the resist layer 14 having a double-layer structure in which the resist layer 16 having endurance to oxygen dry etching is applied onto the lower resist layer 15 that is applied onto the to-be-processed substrate 12 and can be removed by dry etching. Alternatively, it is possible to use a resist layer having a three-layer structure in which an oxygen plasma etching endurance layer (not shown) is formed on the lower resist layer 15 that is applied onto the to-be-processed substrate 12 and can be removed by dry etching, and the resist layer 16 is further applied onto the oxygen plasma etching endurance layer.

The applications of the resists 14, 15, and 16 can be performed by using known application apparatuses such as a spin coater, a dip coater, and a roller coater, and known methods.

The film thicknesses are comprehensively determined by taking into account the processing depth of the to-be-processed substrate 12, and the plasma etching endurances and light intensity profiles of the resists. Normally, the applications are preferably performed so that the film thicknesses fall within the range of 10 nm to 300 nm after prebake.

Further, prior to the applications of the resists 14, 15, and 16, one or more of the following high-boiling-point solvents may be added to reduce the film thicknesses after the prebake: benzyl ethyl ether, di-n-hexyl ether, diethylene glycol monomethyl ether, diethylene glycol monoethyl ether, acetonylacetone, isophorone, capronic acid, caprylic acid, 1-octanol, 1-nonanol, benzyl alcohol, benzyl acetate, ethyl benzoate, diethyl oxalate, diethyl maleic acid, γ-butyrolactone, ethylene carbonate, propylene carbonate, ethylene glycol monophenyl ether acetate, and the like.

After the application, the resist layers are prebaked at 80° C. to 200° C., or more preferably, at 80° C. to 150° C. In the prebake, a heating means such as a hot plate or a hot air drying machine can be used.

After the near-field exposure, post-exposure heating is performed. The post-exposure heating is performed at 80° C. to 200° C., or more preferably, at 80° C. to 150° C. In the post-exposure heating, a heating means such as a hot plate or a hot air drying machine can be used.

After the to-be-processed substrate 12 is heated as needed, the resist layers subjected to the near-field exposure is developed with an alkaline aqueous solution, an aqueous developer, an organic solvent, or the like. Examples of development methods that can be used include a dip method, a spray method, a brushing method, and a slapping method. In this manner, a near-field resist pattern is formed.

When the resist pattern 16*a* formed through a near-field exposure is made to have a high aspect ratio by a resist layer having a double-layer stack structure, oxygen plasma etching is performed, with the pattern 16*a* being used as a mask. Examples of oxygen-containing gases that can be used in the oxygen plasma etching include oxygen, a mixed gas of oxygen and an inert gas such as an argon gas, or a mixed gas of oxygen and carbon monoxide, carbon dioxide, ammonia, dinitrogen monoxide, sulfur dioxide, or the like.

When the resist pattern 16*a* formed through a near-field exposure is made to have a high aspect ratio by a resist layer having a three-layer stack structure, etching is performed on the oxygen plasma etching endurance layer, with the pattern 16*a* being used as a mask. Wet etching or dry etching may be performed as the etching. However, dry etching is more suitable for forming fine patterns, and therefore, is more preferable.

As the wet etching agent, a hydrofluoric acid solution, an ammonium fluoride aqueous solution, a phosphoric acid aqueous solution, an acetic acid aqueous solution, a nitric acid aqueous solution, a cerium ammonium nitrate aqueous solution, or the like can be used, depending on the object to be etched.

Examples of gases for the dry etching include $CHF_3$, $CF_4$, $C_2F_6$, $CF_6$, $CCl_4$, $BCl_3$, $Cl_2$, HCl, $H_2$, and Ar, and a combination of some of those gases can be used as needed.

After the etching of the oxygen plasma etching endurance layer, oxygen plasma etching is performed in the same manner as in the case of a resist layer having a double-layer stack structure, and the pattern is transferred to the lower resist layer 15.

By using the device manufacturing method according to this embodiment, the following devices or elements (1) through (6) can be manufactured:

(1) a semiconductor device;

(2) a quantum dot laser element having a structure in which GaAs quantum dots of 50 nm in size are two-dimensionally arranged at 50-nm intervals;

(3) a subwavelength structure (SWS) in which conical $SiO_2$ members of 50 nm in size are two-dimensionally arranged at 50-nm intervals on a $SiO_2$ substrate, and a light reflection preventing function is provided;

(4) a photonic crystal optical device or a plasmon optical device having a structure in which 100-nm members made of GaN or a metal are two-dimensionally and periodically arranged at 100-nm intervals;

(5) a biosensor element or a micro total analysis system (μTAS) element that has a structure in which Au fine particles of 50 nm in size are two-dimensionally arranged at 50-nm intervals on a plastic substrate, and uses local plasmon resonance (LPR) or surface-enhanced Raman spectroscopy (SERS); and (6) a nanoelectromechanical system (NEMS) element such as a SPM probe having a sharp structure that is used in scanning probe microscopes (SPM) such as a tunnel microscope, an atomic force microscope, and a near-field optical microscope, and are of 50 nm or less in size.

EXAMPLE

The following is a description of an example of the third embodiment.

A to-be-processed substrate having a resist applied thereto was placed on the side of the near-field light generating film pattern of a near-field exposure mask. The to-be-processed substrate 12 used here is a silicon substrate. As the resist, an i-ray resist was used. The resist was applied onto the silicon substrate by a spin coater, and was baked on a hot plate at an atmospheric temperature of 90° C. for 90 seconds, which was the heat treatment period. The film thickness of the resist layer was 100 nm. An exposure was performed, while the near-field exposure mask and the to-be-exposed substrate were in close contact with each other (without any non-contact region) in the area in which the pattern was to be formed.

A 1.5 μm infrared laser was used as the light source for the near-field exposure. The illumination intensity was approximately 85 mJ/cm$^2$ in the i-ray on the upper surface of the mask.

The to-be-processed substrate subjected to the near-field exposure was immersed in a 2.38% tetramethylammonium hydroxide aqueous solution for 10 seconds at room temperature, and was thus developed. A line-and-space pattern of 20 nm in half pitch and approximately 100 nm in depth was obtained where the exposure time was two minutes, and a line-and-space pattern of 50 nm in half pitch and approximately 100 nm in depth was obtained when the exposure time was one minute.

Fourth Embodiment

Referring now to FIGS. 4A through 7B, a near-field exposure method according to a fourth embodiment is described. The near-field exposure method according to the fourth embodiment is a method for shortening the exposure time by lowering the reflectivity at the interface between the air and Si.

Figures 4A, 4B, 4C, 4D, 4E:
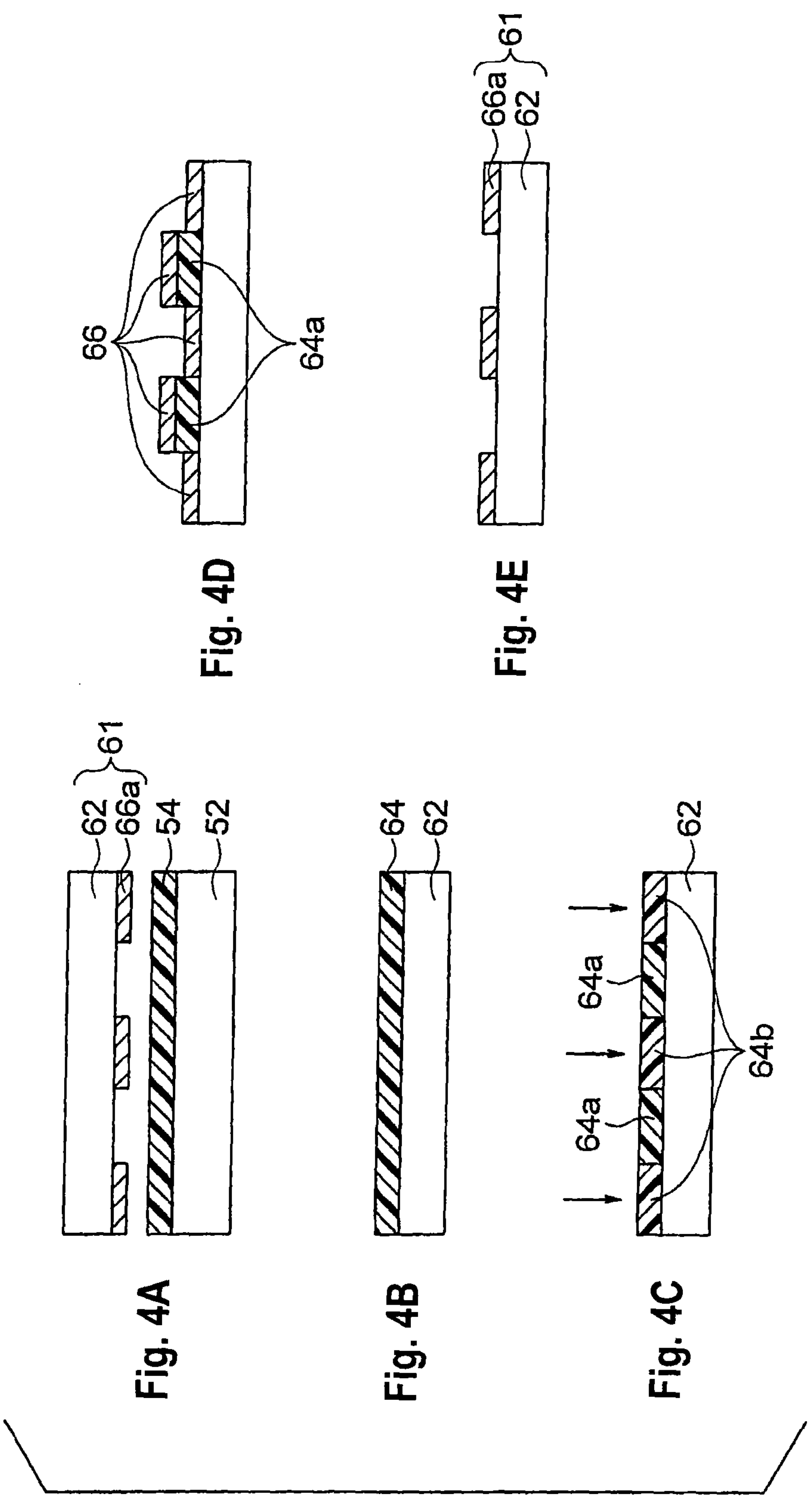
FIGS. 4A through 4E are cross-sectional views for explaining a near-field exposure method according to a fourth embodiment.

First, as shown in FIG. 4A, a resist layer 54 is formed on a silicon substrate (also referred to as a Si substrate) 52 by using a spin coating technique. Although a spin coating technique is used as the resist forming method in this embodiment, the resist forming method is not limited to that technique. As the resist, an i-ray resist is used, and the thickness of the resist layer 54 is approximately 50 nm. Although the thickness of the i-ray resist layer 54 is 50 nm in this embodiment, it is not limited to 50 nm.

As shown in FIG. 4A, a near-field exposure mask 61 having a near-field light generating film pattern 66a formed on the Si substrate 62 is prepared, and is positioned so that the resist layer 54 and the near-field light generating film pattern 66a face each other. The near-field exposure mask 61 is manufactured in the following manner. As shown in FIG. 4B, a resist 64 is applied onto the Si substrate 62. A pattern 64b irradiated by electron beam irradiation is then drawn on the resist 64 by an electron beam lithography apparatus (FIG. 4C). At this point, in the resist 64, there exist regions 64a not irradiated by electron beam irradiation. The pattern formation is not necessarily performed by an electron beam lithography apparatus. After the pattern 64b is drawn, a development is performed with a developer. After the development, cleaning is performed with ultrapure water, and moisture is removed by an air blow. As a result, a pattern 64a formed with the regions not irradiated by electron beam irradiation is left. As the resist 64, it is possible use a material from which a pattern formed with regions not irradiated by electron beam irradiation is removed, and a pattern formed with regions irradiated by electron beam irradiation is not removed. A near-field light generating film 66 is formed on the Si substrate having the pattern 64a formed thereon by a vapor deposition technique or a sputtering technique. Cr is used as the material of the near-field light generating film 66, and a mask with a line width of 200 nm, a space width of 200 nm, and a height of 40 nm is formed. The remaining resist 64a is removed by an organic solvent such as acetone. FIG. 4E shows the completed near-field exposure mask 61.

Figure 5A:
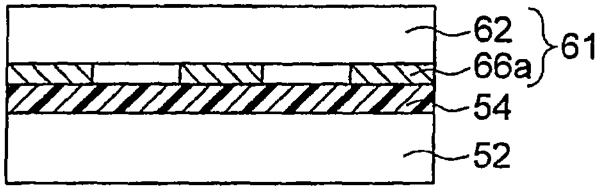
FIGS. 5A through 5C are cross-sectional views for explaining a near-field exposure method according to the fourth embodiment.
Figure 5B:
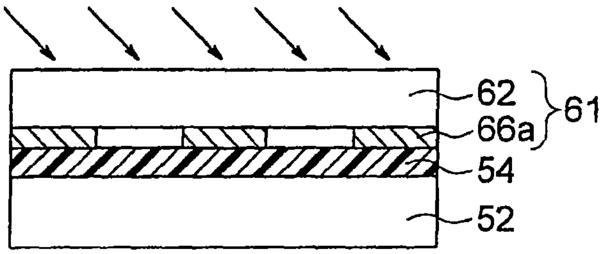
Figure 5C:
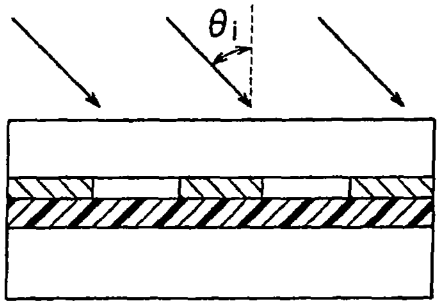

As shown in FIG. 5A, the near-field light generating film pattern 66a of the near-field exposure mask 61 is brought into contact with the resist layer 54. As shown in FIG. 5B, light of 1550 nm in wavelength is emitted onto the back surface of the mask 61. At this point, if the light is emitted obliquely, the reflectivity at the interface between the air and the Si substrate 62 of the mask 61 can be lowered. The incident polarized light for generating near-field light at the edge portions of the near-field light generating film pattern 66a is p-polarized light. The reflectivity R$_p$ at the interface between the air and the Si substrate 62 is expressed by the following mathematical formulas (1):

$$R_p = \left| \frac{N_{ti}^2 \cos\theta_i - \sqrt{N_{ti}^2 - \sin^2\theta_i}}{N_{ti}^2 \cos\theta_i + \sqrt{N_{ti}^2 - \sin^2\theta_i}} \right|^2, \tag{1}$$

$$N_{ti} = \frac{N_t}{N_i} = \frac{n_t + i\kappa_i}{n_i + i\kappa_i}$$

Figure 6:
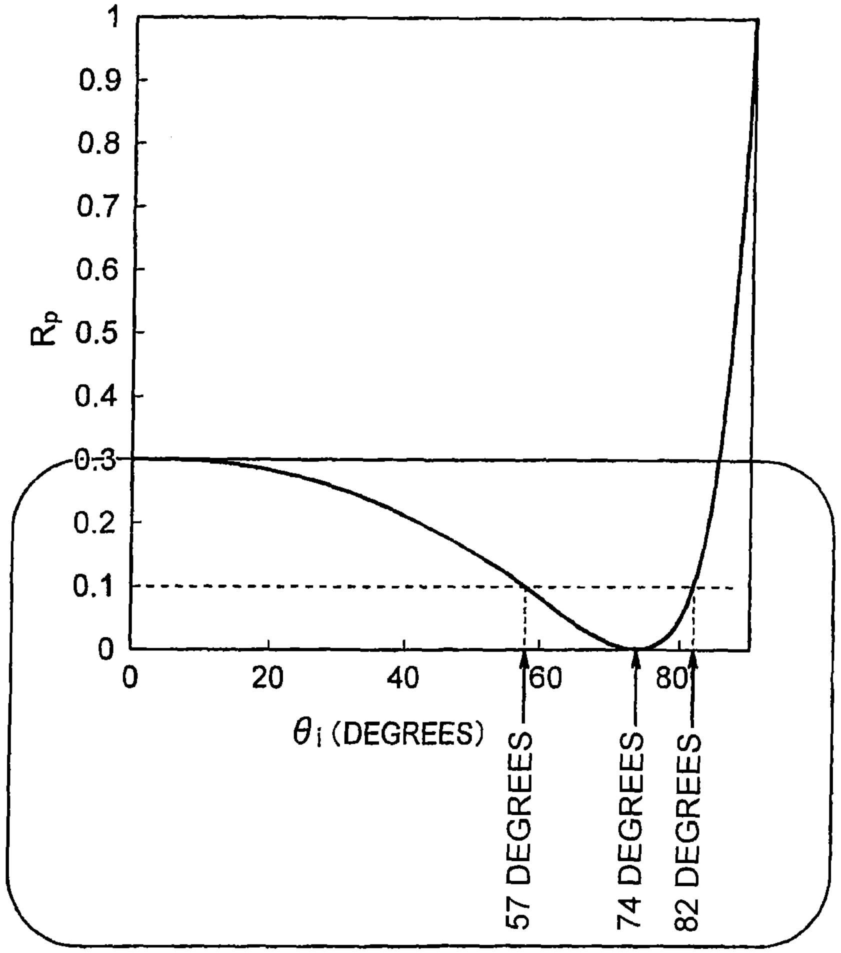
FIG. 6 is a diagram showing the dependence of the resistivity on the incident angle.

Here, N$_t$ represents the complex refractive index of Si, and N$_i$ represents the complex refractive index of the air. N$_{ti}$ represents the ratio between the complex refractive indexes. Further, n$_t$ represents the refractive index of Si, κ$_t$ represents the extinction coefficient of Si, n$_i$ represents the refractive index of the air, κ$_i$ represents the extinction coefficient of the air, and θ$_i$ represents the incident angle. Where n$_t$ is set to 3.48, κ$_t$ is 0, n$_i$ is 1, and κ$_i$ is 0, so as to determine the reflectivity at the interface between the air and the Si substrate, the dependence of the reflectivity R$_p$ on the incident angle θ$_i$, shown in FIG. 6, is obtained. As can be seen from FIG. 6, the reflectivity is lowered to approximately 10$^{-6}$ particularly where the incident angle is 74 degrees, which is much lower than the reflectivity in the case of vertical incidence. Further, where the incident angle is not 74 degrees, the reflectivity becomes higher, and the exposure time becomes longer accordingly. To perform the exposure process with high efficiency, the incident angle is preferably 57 to 82 degrees, so that the reflectivity becomes 10% or lower.

Figure 7A:
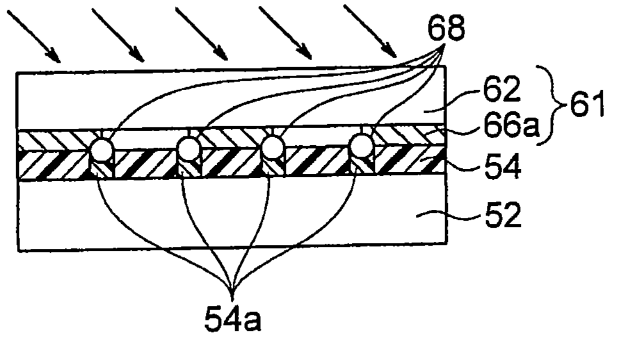
FIGS. 7A and 7B are cross-sectional views for explaining a near-field exposure method according to the fourth embodiment.
Figure 7B:
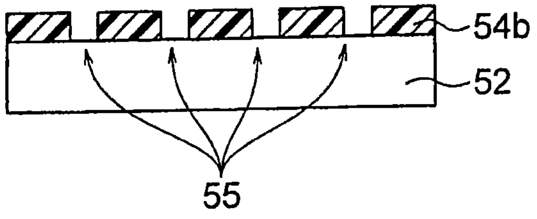

As a result, as shown in FIG. 7A, a large amount of incident light propagates in the Si substrate 62, and near-field light is efficiently generated at the edge portions of the near-field light generating film pattern 66a of the near-field exposure mask 61. The resist portions 54a in the vicinities of the portions 68 at which the near-field light is generated become dissociated through a multistep transition process. In the fourth embodiment, a LED of 1550 nm in wavelength is used, and a 1-hour exposure is performed with an incident power of 60 mW. The Si substrate 52 having the exposed resist layer 54 is immersed in a developer, and a 30-second development is performed. Cleaning is then performed with pure water, and moisture is removed by an air blow. As shown in FIG. 7B, the exposed resist portions 54*a* are dissolved in the developer, to form groove portions 55. Accordingly, a pattern 54*b* having a width of 50 nm and a depth of 50 nm, which correspond to the edge portions of the near-field light generating film pattern 66*a* of the near-field exposure mask 61, can be formed on the Si substrate 52. The depth of 50 nm corresponds to the leakage length of the intensity of the near-field light generated at the edge portions of the near-field light generating film pattern 66*a* of the near-field exposure mask 61.

As described above, according to the fourth embodiment, the reflectivity at the interface between the air and Si can be lowered, and the exposure time can be shortened.

Fifth Embodiment

In the fourth embodiment, exposures are performed by irradiating the back surface of the near-field exposure mask 61 (the surface of the Si substrate on the opposite side from the side on which the near-field light generating film pattern 66*a* is formed) with light. On the other hand, a near-field exposure method according to a fifth embodiment is a method of irradiating the surface of the near-field exposure mask 61, or the surface on which the near-field light generating film pattern 66*a* is formed, with light. Referring now to FIGS. 8A through 8D, the near-field exposure method according to the fifth embodiment is described.

Figures 8A, 8B, 8C, 8D:
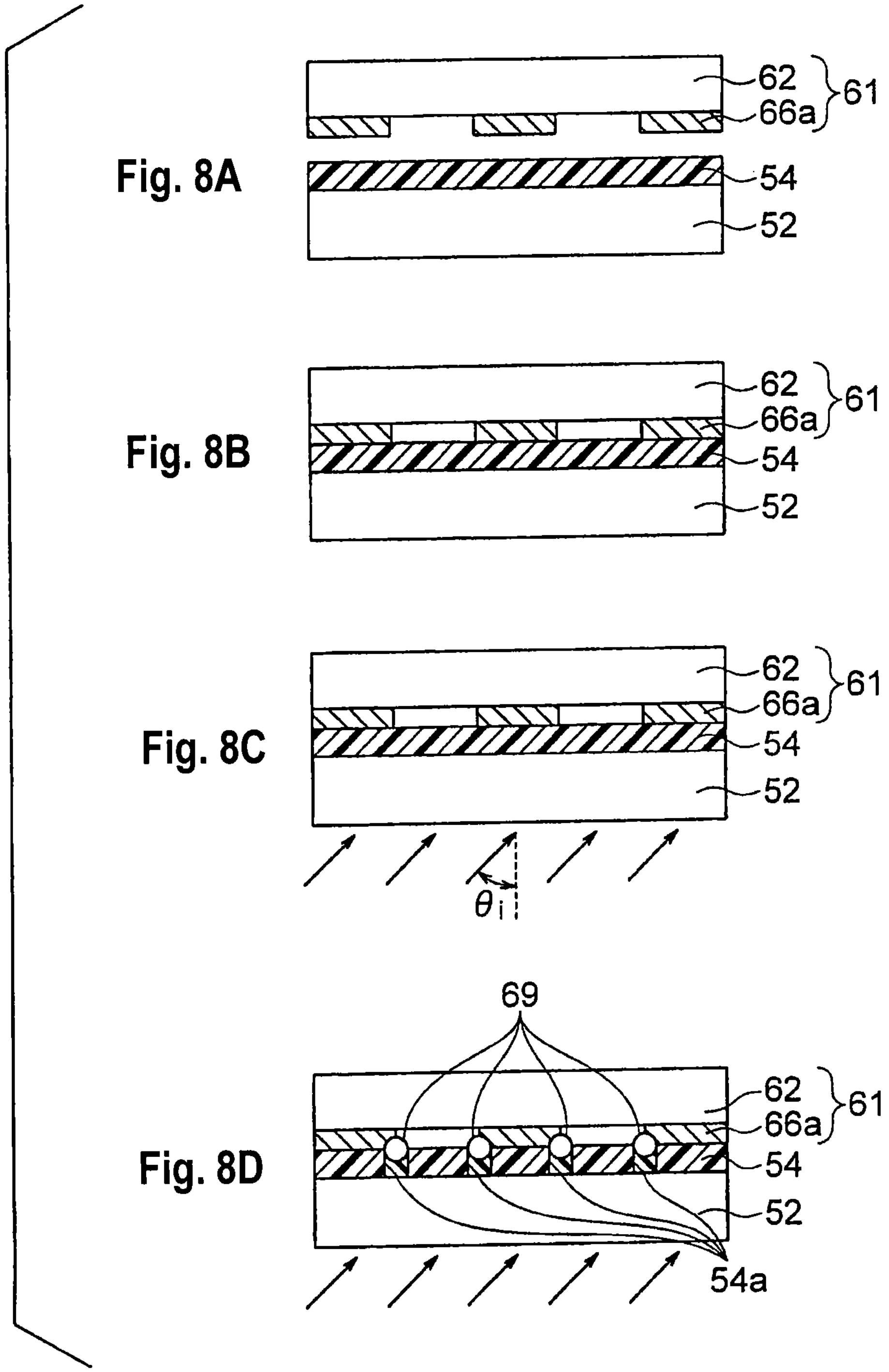
FIGS. 8A through 8D are cross-sectional views for explaining a near-field exposure method according to a fifth embodiment.

First, as shown in FIG. 8A, a resist layer 54 is formed on a Si substrate 52 by using an application technique such as a spin coating technique, as in the fourth embodiment. As shown in FIG. 8A, a near-field exposure mask 61 having a near-field light generating film pattern 66*a* formed on the Si substrate 62 is prepared. The near-field exposure mask 61 has the same structure as that used in the fourth embodiment.

As shown in FIG. 8B, the near-field light generating film pattern 66*a* is then brought into contact with the resist layer 54. As shown in FIG. 8C, light of 1550 nm in wavelength is then emitted onto the front surface of the near-field exposure mask 61. The incident polarized light is p-polarized light. The incident light enters at an oblique angle $\theta_i$. The light propagates in the resist layer 54, but the wavelength used here is much longer than the wavelength with which resists are exposed. Therefore, no exposures are performed. However, the light that reaches the interface between the near-field light generating film pattern 66*a* of the near-field exposure mask 61 and the resist layer 54 is converted into near-field light 69 at the edge portions of the near-field light generating film pattern 66*a*. The resist portions 54*a* in the vicinities of the regions in which the near-field light 69 is generated are dissociated through a multistep transition process. Accordingly, a fine pattern can also be formed when light is emitted onto the front surface of the near-field exposure mask 61.

Figure 9:
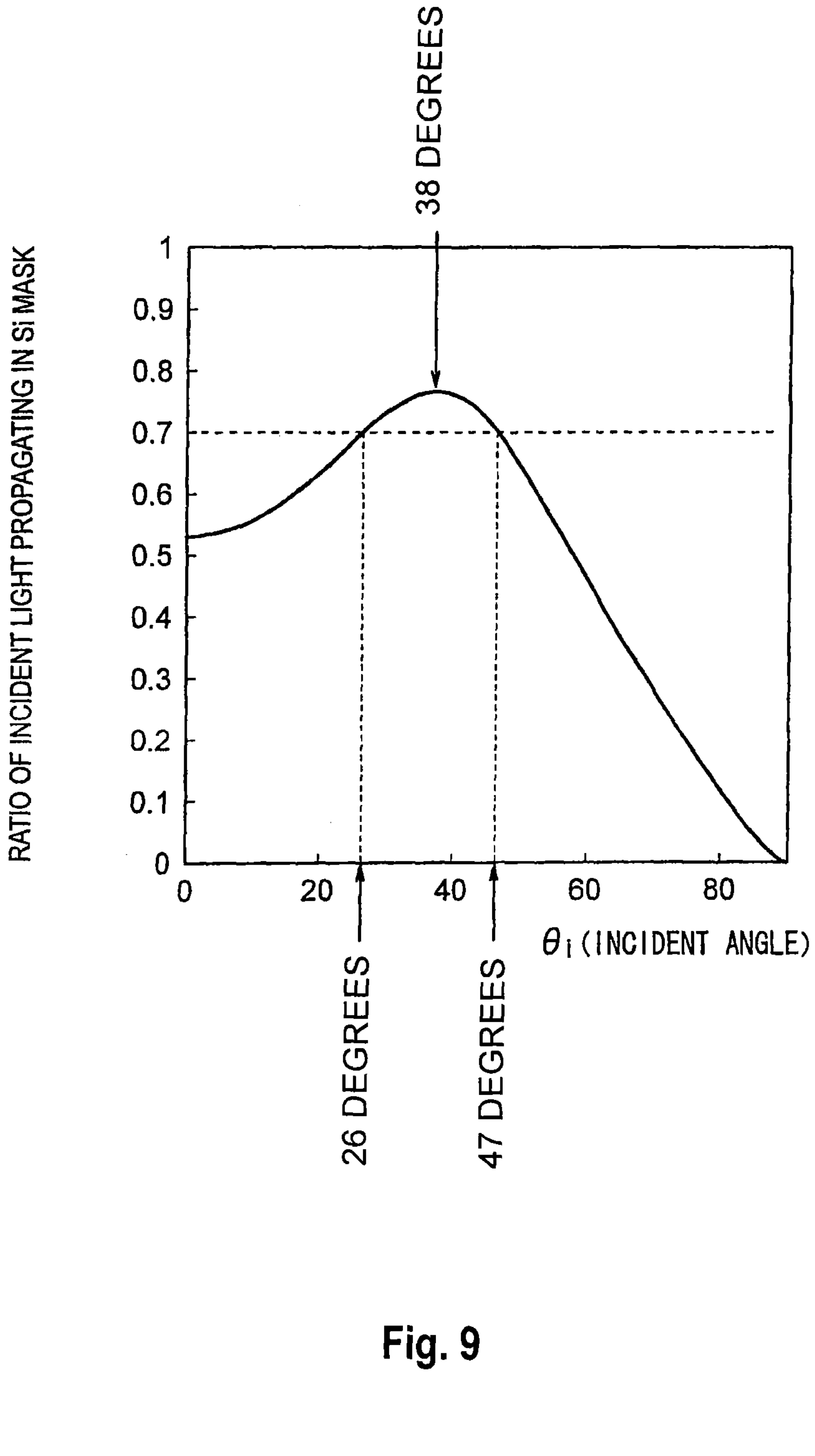
FIG. 9 is a graph showing the ratio of the incident light propagating in a Si substrate with respect to the incident angle.

To generate near-field light efficiently at the edge portions of the near-field light generating film pattern 66*a* of the near-field exposure mask 61 when light of 1550 nm in wavelength is emitted onto the back surface of the near-field exposure mask 61, the reflectivity at the interface between the air and the Si substrate 62 needs to be lowered, and the amount of light propagating to the edge portions of the near-field light generating film pattern 66*a* needs to be increased. In the fifth embodiment, by using the formulas (1) as in the fourth embodiment, the ratio of the incident light propagating in the Si substrate 52 to the incident angle $\theta_i$ can also be calculated, as shown in FIG. 9. Here, the refractive index of the resist layer 54 is 1.70, and the extinction coefficient is 0. As can be seen from FIG. 9, where the incident angle is 38 degrees, a transmissivity of 77% is obtained, and the light amount becomes 45% larger than that in the case of vertical incidence. Further, where the incident angle is not 38 degrees, the transmissivity becomes lower, and the exposure time becomes longer accordingly. To efficiently perform the exposure process, the incident angle is preferably 26 to 47 degrees, so that the transmissivity becomes 90% or higher. As a result, as shown in FIG. 8D, a large amount of incident light propagates in the resist layer 54, and the near-field light 69 is efficiently generated at the edge portions of the near-field light generating film pattern 66*a*. The resist portions 54*a* in the vicinities of the regions in which the near-field light 69 is generated are dissociated through a multistep transition process. A LED of 1550 nm in wavelength is used as the injection light source, and a 2-hour exposure is performed with an incident power of 30 mW. The Si substrate 52 having the exposed resist layer 54 is immersed in a developer, and a 30-second development is performed. Cleaning is then performed with pure water, and moisture is removed by an air blow. The exposed resist portions 54*a* are dissolved in the developer, and a pattern corresponding to the edge portions of the near-field light generating film pattern 66*a* is formed. Accordingly, a pattern having a width of 50 nm and a depth of 50 nm, which correspond to the edge portions of the near-field light generating film pattern 66*a* can be formed.

When light is emitted onto the front surface of the near-field exposure mask 61 as in the fifth embodiment, near-field light is more readily generated at the edge portions of the near-field light generating film pattern 66*a* of the near-field exposure mask 61 than when light is emitted onto the back surface of the near-field exposure mask 61 as in the fourth embodiment. This is because, when light is emitted onto the back surface of the near-field exposure mask 61, near-field light is generated at the edge portions of the near-field light generating film pattern 66*a* on the side of the Si substrate 62, and the near-field light moves to the edge portions of the near-field light generating film pattern 66*a* on the side of the resist layer 54, to expose the resist layer 54. While the near-field light is moving from the edge portions of the near-field light generating film pattern 66*a* on the side of the Si substrate 62 to the edge portions of the near-field light generating film pattern 66*a* on the side of the resist layer 54, part of the near-field light is absorbed by the near-field light generating film pattern 66*a*, and the intensity of the near-field light becomes lower. In the case where light is emitted onto the front surface of the near-field exposure mask 61, near-field light is generated at the edge portions of the near-field light generating film pattern 66*a* on the side of the resist layer 54 after propagating in the resist layer 54. Accordingly, the decrease in the intensity of the near-field light by the near-field light generating film pattern 66*a* is not caused as in the case where light is emitted onto the back surface of the near-field exposure mask 61.

As described above, according to the fifth embodiment, the reflectivity at the interface between the air and Si can be lowered, and the exposure time can be shortened.

Sixth Embodiment

In the first and second embodiments, Cr is used as the material of the near-field light generating film pattern 66*a*. However, a near-field exposure method according to a sixth embodiment is a method by which Au is used as the material of the near-field light generating film pattern 66*a*. Referring now to FIGS. 10A through 11D, the near-field exposure method according to the sixth embodiment is described.

Figures 10A, 10B, 10C, 10D, 10E:
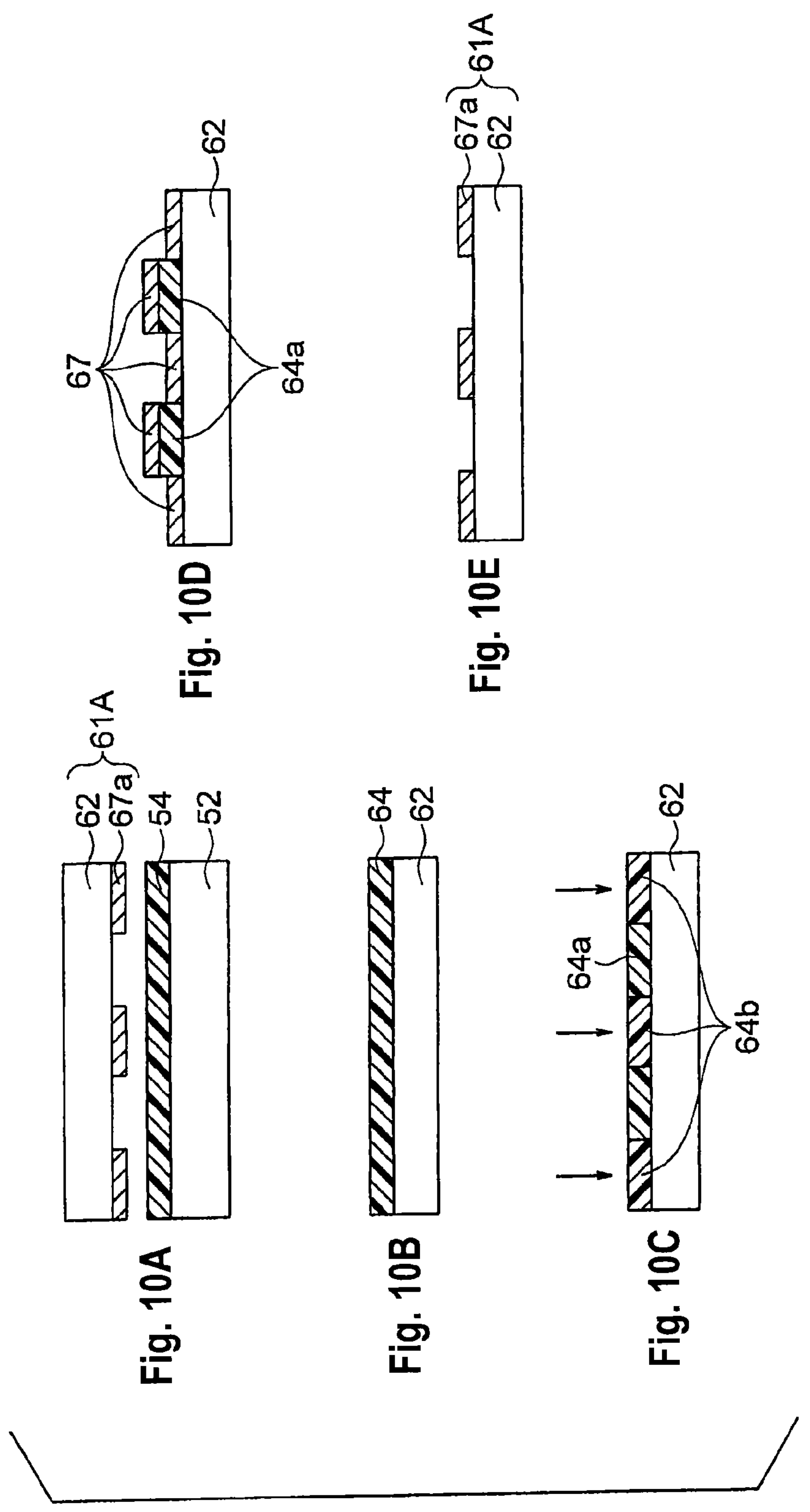
FIGS. 10A through 10E are cross-sectional views for explaining a near-field exposure method according to a sixth embodiment.

First, as shown in FIG. 10A, a resist layer 54 is formed on a Si substrate 52 by an application technique such as a spin coating technique, as in the fourth embodiment. As shown in FIG. 10A, a near-field exposure mask 61A that is made of Au and has a near-field light generating film pattern 67*a* formed on a Si substrate 62 is prepared.

The near-field exposure mask 61A is manufactured in the following manner. As shown in FIG. 10B, a resist layer 64 is applied onto the Si substrate 62. As shown in FIG. 10C, a pattern 64*b* is then drawn on the resist layer 64 by an electron beam lithography apparatus (not shown), for example. The pattern formation is not necessarily performed by an electron beam lithography apparatus. After the pattern 64*b* is drawn, the resist layer 64 is developed with the use of a developer. After the development, cleaning is performed with ultrapure water, and moisture is removed by an air blow. As a result, a pattern 64*a* formed with the regions not irradiated by electron beam irradiation is left on the Si substrate 62. After that, as shown in FIG. 10D, a near-field light generating film 67 is formed on the Si substrate 62 having the pattern 64*a* formed thereon by a vapor deposition technique or a sputtering technique. Au is used as the material of the near-field light generating film 67, and a pattern 67*a* with a line width of 100 nm, a space width of 100 nm, and a height of 40 nm is formed. The remaining resist 64*a* is removed by an organic solvent such as acetone. FIG. 10E shows the completed near-field exposure mask 61A.

Figures 11A, 11B, 11C, 11D:
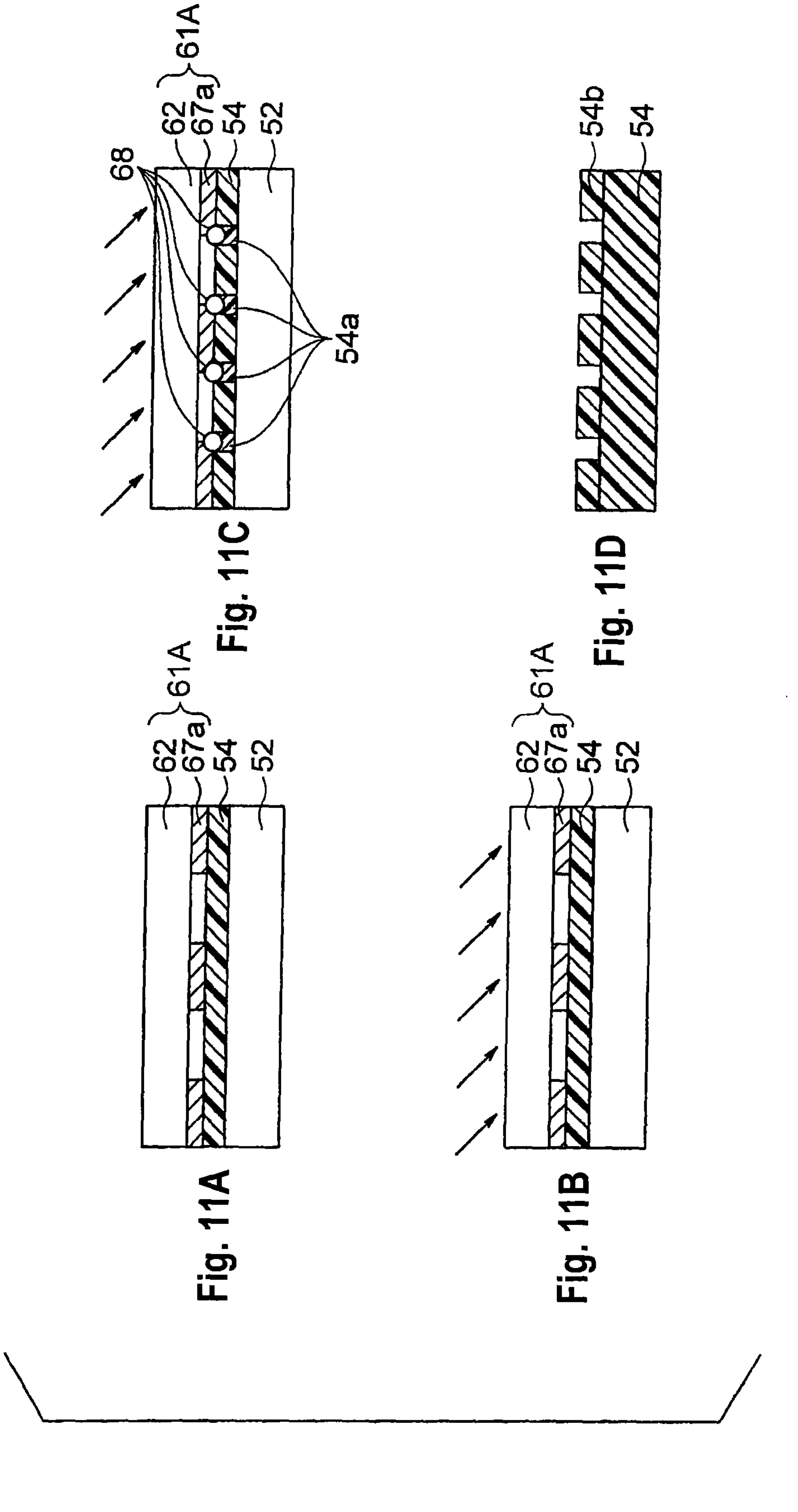
FIGS. 11A through 11D are cross-sectional views for explaining a near-field exposure method according to the sixth embodiment.

The near-field light generating film pattern 67*a* of the near-field exposure mask 61A formed in the above manner is brought into contact with the resist layer 54 (FIG. 11A). As shown in FIG. 11B, a LED of 1550 nm in wavelength is used, and the upper face (the back surface) of the near-field exposure mask 61A is exposed for fifteen minutes with an incident power of 60 mW. The incident polarized light is p-polarized light, and the incident angle is 74 degrees.

Near-field light 68 is generated at the edge portions of the near-field light generating film pattern 67*a* of the near-field exposure mask 61A. The resist portions 54*a* in the vicinities of the portions at which the near-field light 68 is generated become dissociated through a multistep transition process. The exposed sample is developed for 30 seconds with a developer. Cleaning is then performed with pure water, and moisture is removed by an air blow. As shown in FIG. 11D, the exposed resist portions 54*a* are dissolved in the developer, to form a pattern 54*b* having a width of 50 nm and a depth of 50 nm, which correspond to the edge portions of the near-field light generating film pattern 67*a*.

As described above, according to the sixth embodiment, the reflectivity at the interface between the air and Si can be lowered, and the exposure time can be shortened.

Seventh Embodiment

Referring now to FIGS. 12A through 12E, a near-field exposure method according to a seventh embodiment is described. In the seventh embodiment, a near-field exposure mask having an antireflection film formed on the near-field exposure mask 61 of the fourth embodiment is used.

Figures 12A, 12B, 12C, 12D, 12E:
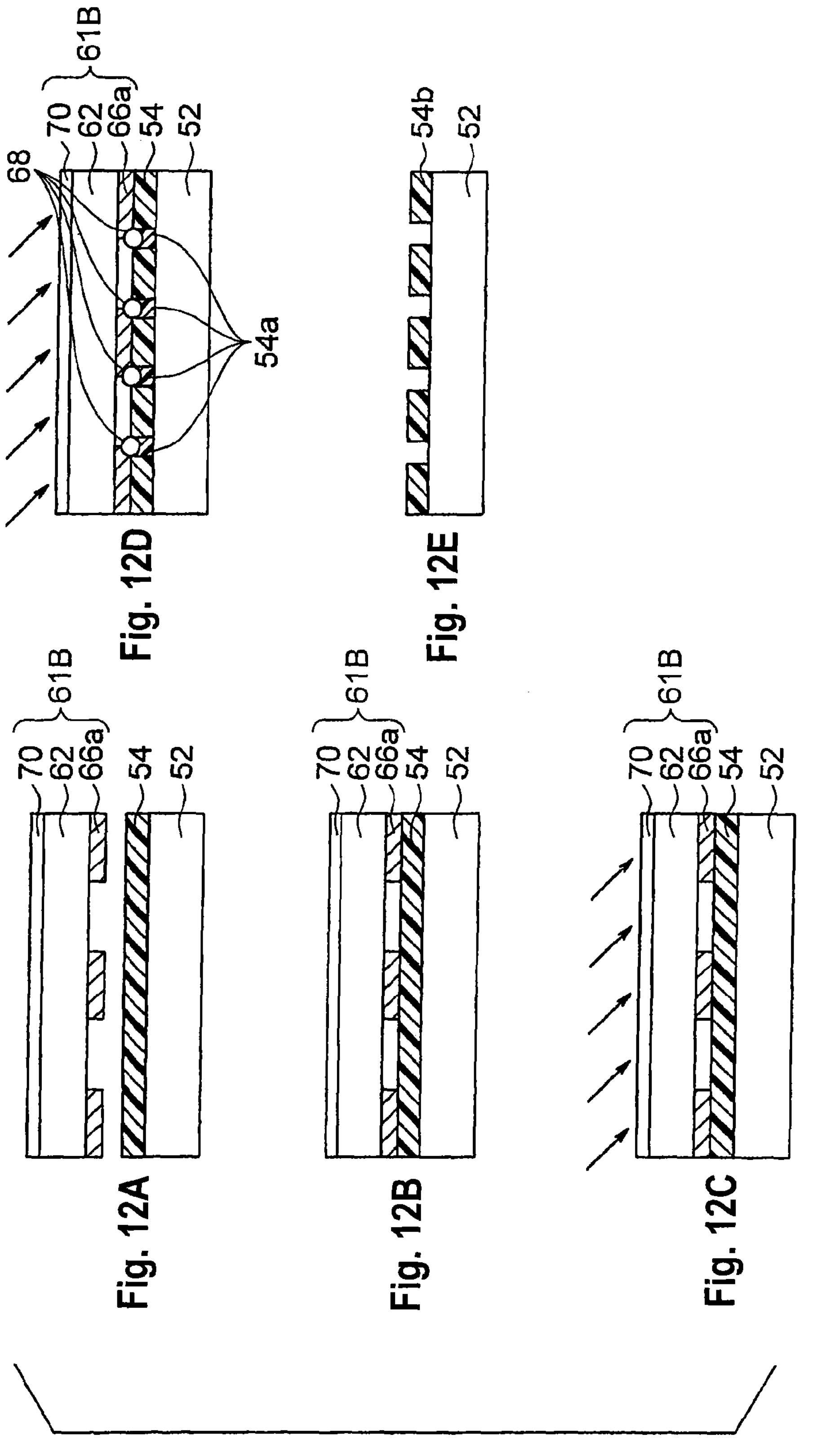
FIGS. 12A through 12E are cross-sectional views for explaining a near-field exposure method according to a seventh embodiment.

First, as shown in FIG. 12A, a resist layer 54 is formed on a Si substrate 52 by an application technique such as a spin coating technique, as in the fourth embodiment. As shown in FIG. 12A, a near-field exposure mask 61B having a near-field light generating film pattern 66*a* and an antireflection film 70 formed on a Si substrate 62 is prepared. The antireflection film 70 is formed by a vapor deposition technique on the surface of the Si substrate 62 on the opposite side from the side on which the near-field light generating film pattern 66*a* is formed. In the seventh embodiment, the antireflection film 70 is formed by a vapor deposition technique, but is not necessarily formed by that technique. The antireflection film 70 can be a $MgF_2$ film, a $SiO_2$ film, a $TiO_2$ film, a $ZnO_2$ film, a $CeF_3$ film, or the like. The antireflection film 70 can be either a single layer structure or a multilayer structure.

As shown in FIG. 12B, the near-field light generating film pattern 66*a* is then brought into contact with the resist layer 54. As shown in FIG. 12C, a LED of 1550 nm in wavelength is used, and the upper face (the back surface) of the near-field exposure mask 61B is exposed for one hour with an incident power of 60 mW. The incident polarized light is p-polarized light, and the incident angle is 45 degrees. When the incident angle is greater than 74 degrees as in the fourth embodiment, the reflectivity becomes higher. However, the formation of the antireflection film 70 on the near-field exposure mask 61B can lower the reflectivity of the incident light power. As an exposure is performed, near-field light 68 is generated at the edge portions of the near-field light generating film pattern 66*a*, as shown in FIG. 12D The resist portions 54*a* in the vicinities of the portions at which the near-field light 68 is generated become dissociated through a multistep transition process. The exposed sample is developed for 30 seconds with a developer. Cleaning is then performed with pure water, and moisture is removed by an air blow.

As shown in FIG. 12E, the exposed resist portions 54*a* are dissolved in the developer, to form a pattern 54*b* having a width of 50 nm and a depth of 50 nm, which correspond to the edge portions of the near-field light generating film pattern 66*a*.

As described above, according to the seventh embodiment, the reflectivity at the interface between the air and Si can be lowered, and the exposure time can be shortened.

Eighth Embodiment

Referring now to FIGS. 13A through 13E, a near-field exposure method according to an eighth embodiment is described. The eighth embodiment is the same as the seventh embodiment illustrated in FIGS. 12A through 12E, except that a subwavelength structure is provided as the antireflection film.

Figures 13A, 13B, 13C, 13D, 13E:
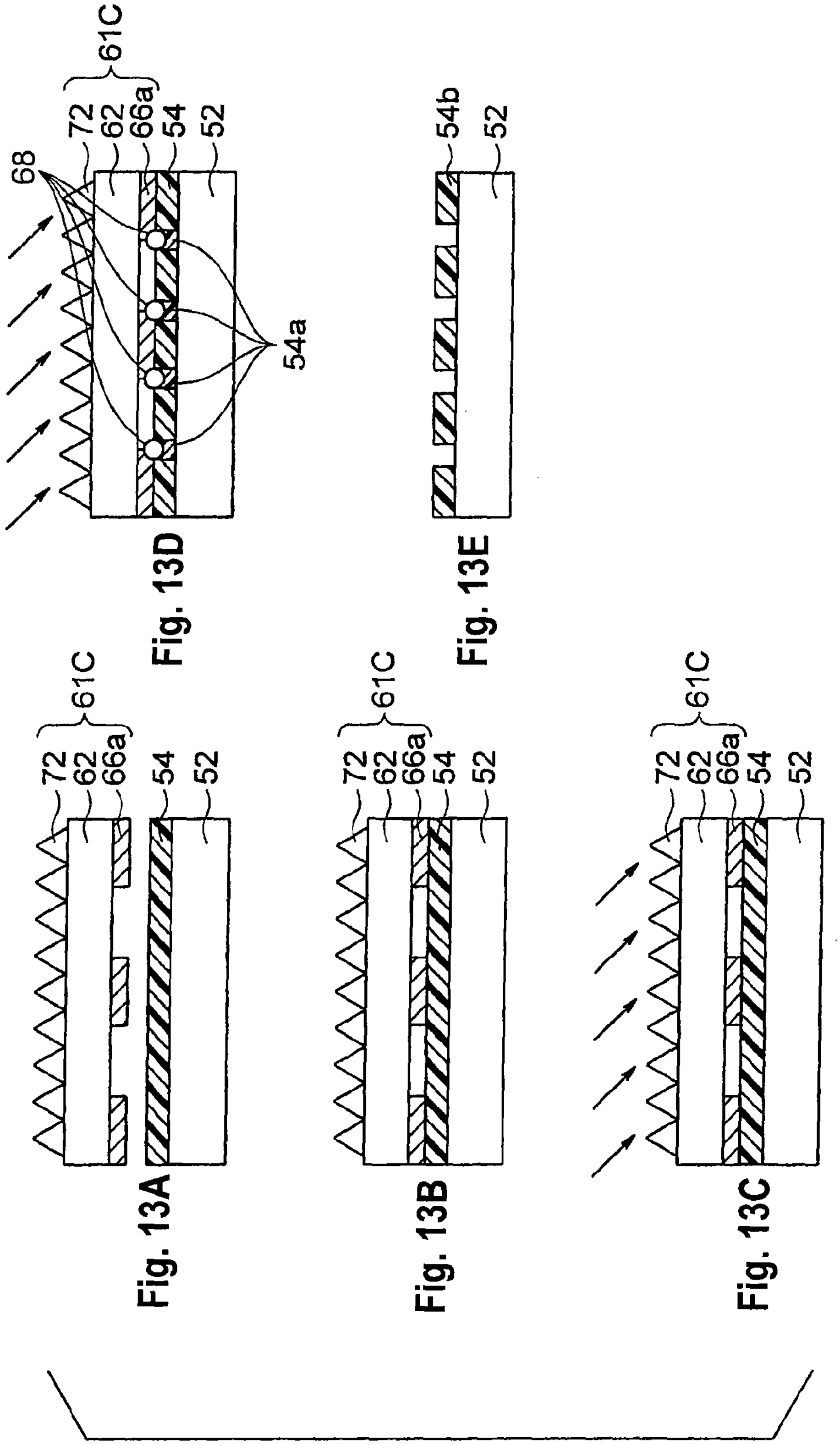
FIGS. 13A through 13E are cross-sectional views for explaining a near-field exposure method according to an eighth embodiment.

First, as shown in FIG. 13A, a resist layer 54 is formed on a Si substrate 52 by an application technique such as a spin coating technique, as in the fourth embodiment. As shown in FIG. 13A, a near-field exposure mask 61C having a near-field light generating film pattern 66*a* and a subwavelength structure 72 formed on a Si substrate 62 is prepared.

The subwavelength structure 72 is manufactured in the following manner. An electron beam resist is applied to the back surface of the Si substrate 62, or to the surface of the Si substrate 62 on the opposite side from the surface on which the near-field light generating film pattern 66*a* is formed. After patterning is performed on the electron beam resist by an electron beam lithography apparatus, for example, etching is performed on the Si substrate 62 with a $SF_6$ gas, for example, with the patterned electron beam resist being used as a mask. In this manner, the subwavelength structure 72 having two-dimensional conic structures can be obtained. The conic structure intervals are 400 nm, for example, and the heights of the conic structures are 700 nm, for example. Although an antireflection film having the subwavelength structure 72 is formed by electron beam lithography in the eighth embodiment, the antireflection film is not necessarily formed by this technique in the present invention.

As shown in FIG. 13B, the near-field light generating film pattern 66*a* of the near-field exposure mask 61C is then brought into contact with the resist layer 54. As shown in FIG. 13C, a LED of 1550 nm in wavelength is used, and the back surface of the near-field exposure mask 61C is exposed for one hour with an incident power of 60 mW. The incident polarized light is p-polarized light, and the incident angle is 45 degrees. When the incident angle is greater than 74 degrees as in the fourth embodiment, the reflectivity becomes higher. However, the formation of the subwavelength structure 72 on the near-field exposure mask 61C can lower the reflectivity of the incident light power. As an exposure is performed, near-field light 68 is generated at the edge portions of the near-field light generating film pattern 66*a*, as shown in FIG. 13D. The resist portions 54*a* in the vicinities of the portions at which the near-field light 68 is generated become dissociated through a multistep transition process. The Si substrate 52 having the exposed resist layer 54 is developed for 30 seconds with a developer. Cleaning is then performed with pure water, and moisture is removed by an air blow. As a result, the exposed resist portions 54*a* are the dissolved in the developer, and a pattern 54*b* having a width of 50 nm and a depth of 50 nm, which correspond to the edge portions of the near-field light generating film pattern 66*a*, can be formed on the Si substrate 52, as shown in FIG. 13E.

As described above, according to the eighth embodiment, the reflectivity at the interface between the air and Si can be lowered, and the exposure time can be shortened.

Ninth Embodiment

Referring now to FIGS. 14A through 14E, a near-field exposure method according to a ninth embodiment is described. The near-field exposure method according to the ninth embodiment is the same as the seventh embodiment illustrated in FIGS. 12A through 12E, except that a multilayer antireflection film is formed as the antireflection film on the back surface of a near-field exposure mask.

Figures 14A, 14B, 14C, 14D, 14E:
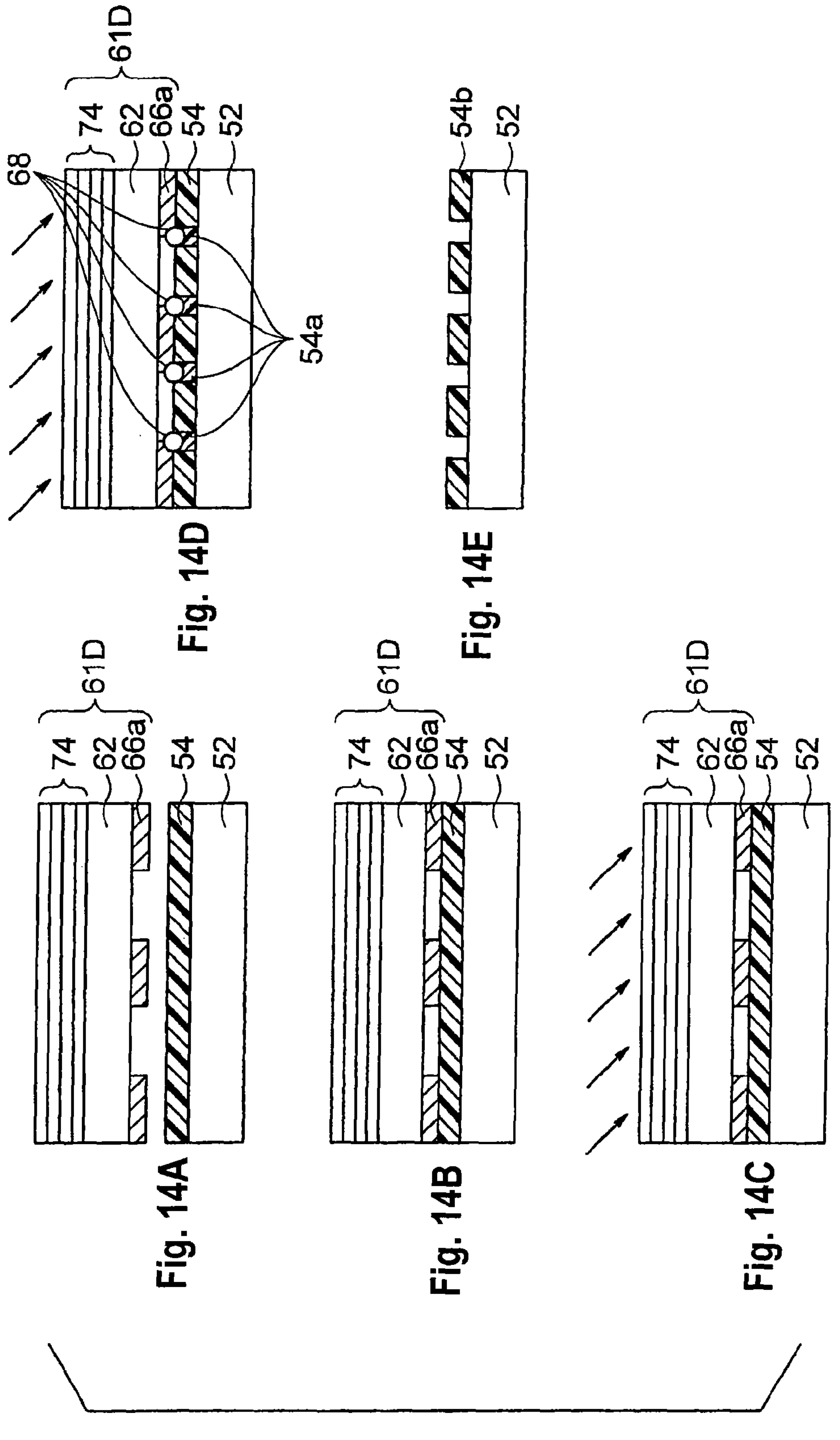
FIGS. 14A through 14E are cross-sectional views for explaining a near-field exposure method according to a ninth embodiment.

First, as shown in FIG. 14A, a resist layer 54 is formed on a Si substrate 52 by an application technique such as a spin coating technique, as in the fourth embodiment. As shown in FIG. 14A, a near-field exposure mask 61D having a near-field light generating film pattern 66*a* and a multilayer antireflection film 74 formed on a Si substrate 62 is prepared. The multilayer antireflection film 74 is formed on the surface of the Si substrate 62 on the opposite side from the surface on which the near-field light generating film pattern 66*a* is formed. The multilayer antireflection film 74 has a structure in which layers are arranged so that the refractive index varies from 1 to 3.48 toward the Si substrate 62 from the light incident side (the side furthest from the Si substrate 62). In this embodiment, the number of layers in the multilayer antireflection film 74 is 10, and each of the layers has a film thickness of 50 nm and is formed by a sputtering technique. At the time of sputtering, the refractive indexes of the respective layers are varied by adjusting the $O_2$ gas mixture ratio in a Si target. Although the antireflection film is formed by a sputtering technique in the ninth embodiment, the antireflection film is not necessarily formed by this technique. $MgF_2$, $SiO_2$, $TiO_2$, $ZnO_2$, $CeF_3$, $As_2S_3$, $SrTiO_3$, AgCl, or the like can be used as the material of the antireflection film. The number of layers in the antireflection film is not particularly limited.

As shown in FIG. 14B, the near-field light generating film pattern 66*a* of the near-field exposure mask 61D is then brought into contact with the resist layer 54. As shown in FIG. 14C, a LED of 1550 nm in wavelength is used, and the back surface of the near-field exposure mask 61D is exposed for one hour with an incident power of 60 mW. The incident polarized light is p-polarized light, and the incident angle is 45 degrees. When the incident angle is greater than 74 degrees as in the fourth embodiment, the reflectivity becomes higher. However, the formation of the multilayer antireflection film 74 on the near-field exposure mask 61D can lower the reflectivity of the incident light power. As an exposure is performed, near-field light 68 is generated at the edge portions of the near-field light generating film pattern 66*a*, as shown in FIG. 14D. The resist portions 54*a* in the vicinities of the portions at which the near-field light 68 is generated become dissociated through a multistep transition process. The Si substrate 52 having the exposed resist layer 54 is developed for 30 seconds with a developer. Cleaning is then performed with pure water, and moisture is removed by an air blow. As a result, the exposed resist portions 54*a* are dissolved in the developer, and a pattern 54*b* having a width of 50 nm and a depth of 50 nm, which correspond to the edge portions of the near-field light generating film pattern 66*a*, can be formed on the Si substrate 52, as shown in FIG. 14E.

As described above, according to the ninth embodiment, the reflectivity at the interface between the air and Si can be lowered, and the exposure time can be shortened.

Tenth Embodiment

Referring now to FIGS. 15A through 15E, a near-field exposure method according to a tenth embodiment is described. The near-field exposure method according to the tenth embodiment is the same as the seventh embodiment illustrated in FIGS. 12A through 12E, except that a multilayer antireflection film 76 is formed as the antireflection film on the back surface of a near-field exposure mask.

Figures 15A, 15B, 15C, 15D, 15E:
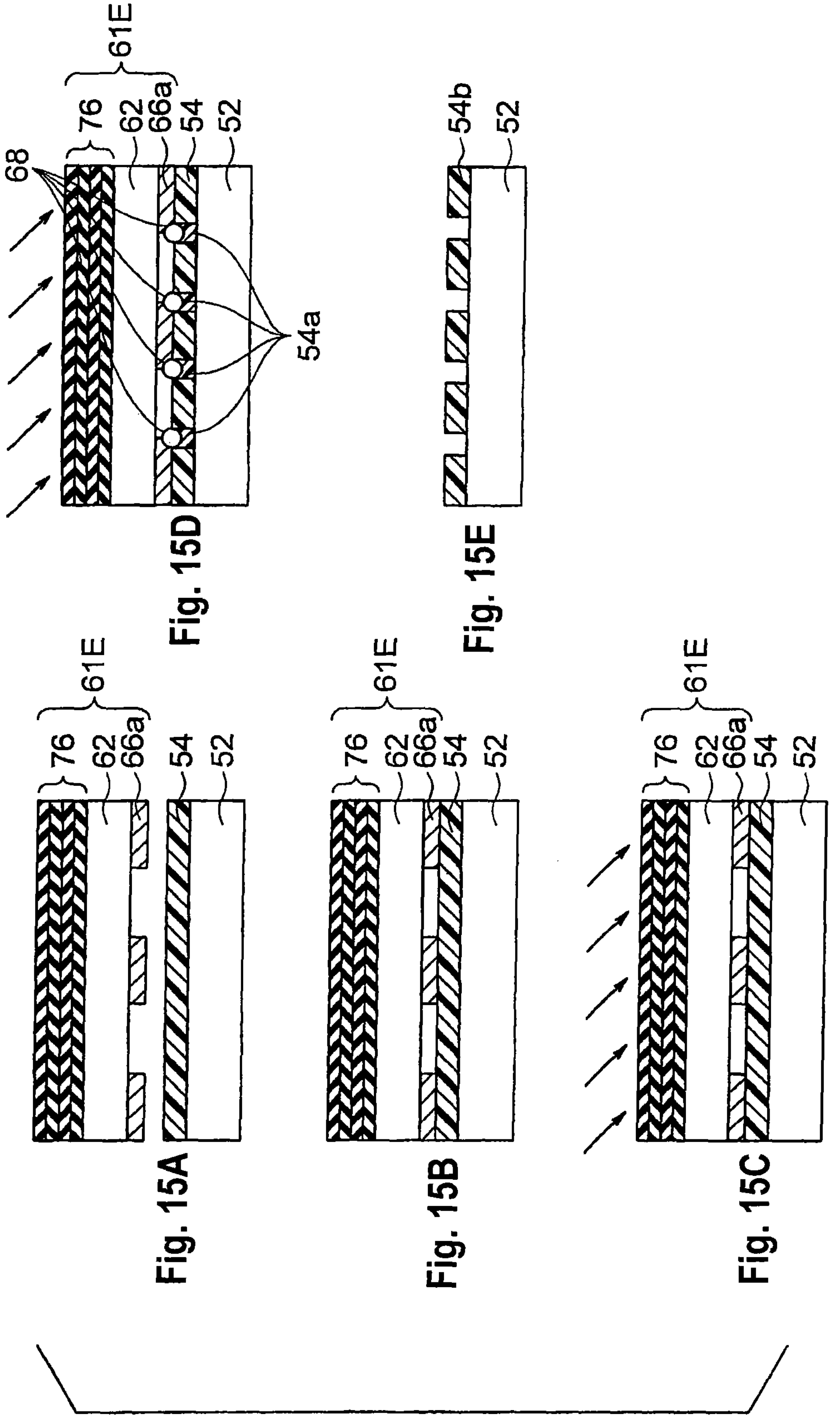
FIGS. 15A through 15E are cross-sectional views for explaining a near-field exposure method according to a tenth embodiment.

First, as shown in FIG. 15A, a resist layer 54 is formed on a Si substrate 52 by an application technique such as a spin coating technique, as in the fourth embodiment. As shown in FIG. 15A, a near-field exposure mask 61E having a near-field light generating film pattern 66*a* and the antireflection film 76 formed on a Si substrate 62 is prepared. The antireflection film 76 has a structure in which thin films with a low refractive index and thin films with a high refractive index are alternately stacked. In the antireflection film 76 in this embodiment, $SiO_2$ layers and $TiO_2$ layers are alternately stacked by using a sputtering technique, the number of layers is 4, and each of the layers has a film thickness of 50 nm. Although the antireflection film is formed by a sputtering technique in this embodiment, the antireflection film is not necessarily formed by this method. $MgF_2$, $SiO_2$, $TiO_2$, $ZnO_2$, $CeF_3$, $As_2S_3$, $SrTiO_3$, AgCl, or the like can be used as the material of the antireflection film. The number of layers in the antireflection film is not particularly limited.

As shown in FIG. 15B, the near-field light generating film pattern 66*a* of the near-field exposure mask 61E is then brought into contact with the resist layer 54. As shown in FIG. 15C, a LED of 1550 nm in wavelength is used, and the back surface of the near-field exposure mask 61E is exposed for one hour with an incident power of 60 mW. The incident polarized light is p-polarized light, and the incident angle is 45 degrees. When the incident angle is greater than 74 degrees as in the fourth embodiment, the reflectivity becomes higher. However, the formation of the multilayer antireflection film 76 on the near-field exposure mask 61E can lower the reflectivity of the incident light power.

As an exposure is performed in the above manner, near-field light 68 is generated at the edge portions of the near-field light generating film pattern 66*a*, as shown in FIG. 15D. The resist portions 54*a* in the vicinities of the portions at which the near-field light 68 is generated become dissociated through a multistep transition process. The exposed sample is developed for 30 seconds with a developer. Cleaning is then performed with pure water, and moisture is removed by an air blow. As a result, the exposed resist portions 54*a* are dissolved in the developer, and a pattern 54*b* having a width of 50 nm and a depth of 50 nm, which correspond to the edge portions of the near-field light generating film pattern 66*a*, can be formed on the Si substrate 52, as shown in FIG. 15E.

As described above, according to the tenth embodiment, the reflectivity at the interface between the air and Si can be lowered, and the exposure time can be shortened.

Eleventh Embodiment

Referring now to FIGS. 16A through 18, a pattern forming method according to an eleventh embodiment is described. The pattern forming method according to the eleventh embodiment is a method established by combining a nanoimprint method and a near-field exposure method.

Figures 16A, 16B, 16C, 16D, 16E:
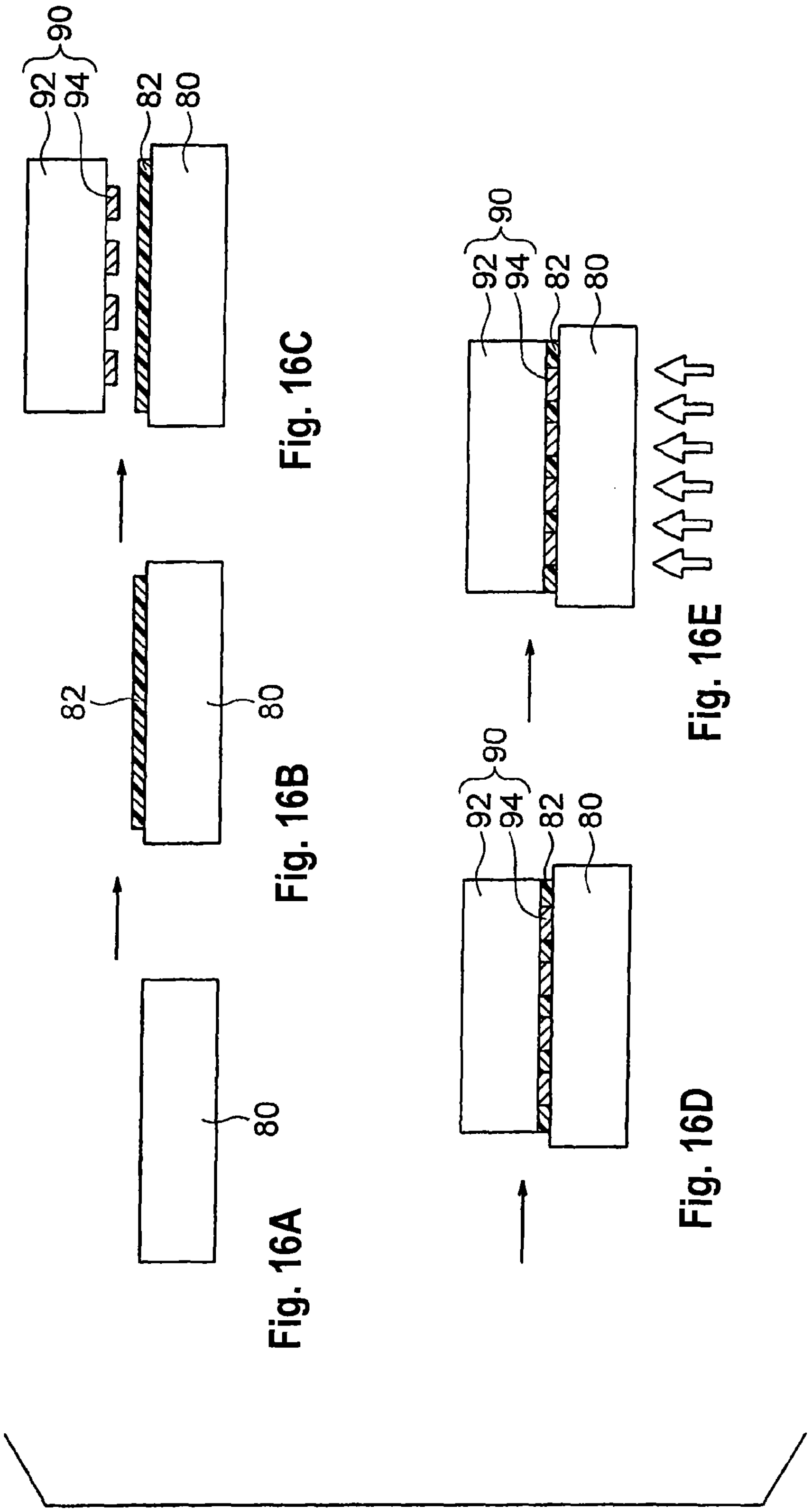
FIGS. 16A through 16E are cross-sectional views for explaining a pattern forming method according to an eleventh embodiment.

First, as shown in FIGS. 16A and 16B, a Si substrate 80 is prepared, and a light-curable resin film 82 is formed on the Si substrate 80. The light-curable resin film 82 may be formed by a spinner technique, for example. By the spinner technique, the number of rotations of the spinner is controlled by taking into account the viscosity and solid content of the light-curable resin film 82, and the evaporation rate of the solvent. In this manner, a desired film thickness can be obtained. After the formation of the light-curable resin film 82, prebake can be performed to remove the solvent contained in the film.

As shown in FIG. 16C, a template 90 having a near-field light generating film pattern 94 formed on a Si substrate 92 is prepared. This template 90 can be a near-field exposure mask according to the first embodiment or any of the fourth through tenth embodiments. The light-curable resin film 82 formed on the Si substrate 80 is then brought into contact with the near-field light generating film pattern 94 of the template 90 (FIG. 16D).

With the light-curable resin film 82 and the near-field light generating film pattern 94 being in contact with each other, light is emitted onto the back surface side of the silicon substrate 80 or the opposite side from the side on which the light-curable resin film 82 is formed. The light irradiation is performed for 0.1 to 20 seconds. As a result, near-field light is generated at the edge portions of the near-field light generating film pattern 94 of the template 90, and the generated near-field light reaches the light-curable resin film 82. Since the light emitted in this embodiment is so-called nonresonant light, the light-curable resin film 82 reacts directly to the emitted light, but is not chemically changed at all when the irradiation time and intensity are adjusted. In the step illustrated in FIG. 16D, the distance between the Si substrate 80 having the light-curable resin film 82 applied thereto and the template 90 can be determined based on the wavelength of the emitted light. In this embodiment, the template 90 is a template having the near-field light generating film pattern 94 formed on the Si substrate 92. However, the template 90 can be a concave-convex mold, and the material of the concave-convex mold can be Si.

Figures 17A, 17B, 17C:
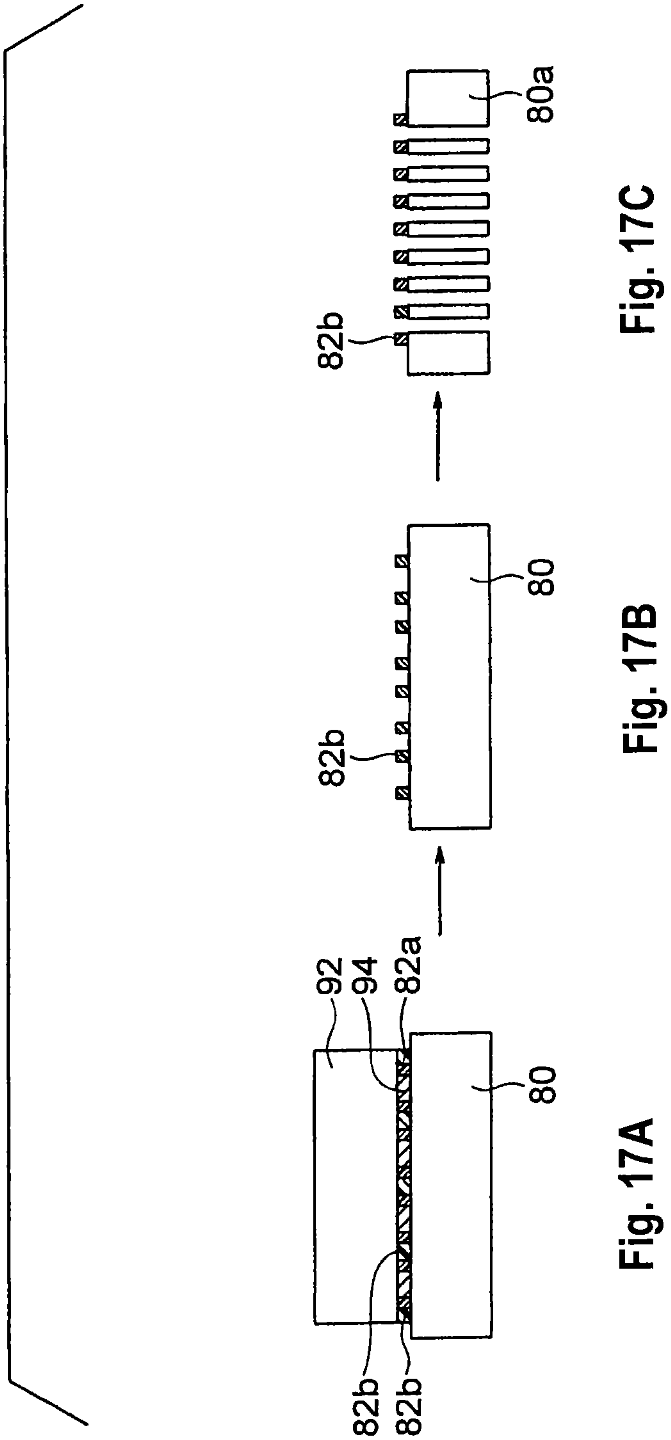
FIGS. 17A through 17C are cross-sectional views for explaining a pattern forming method according to the eleventh embodiment.
Figure 18:
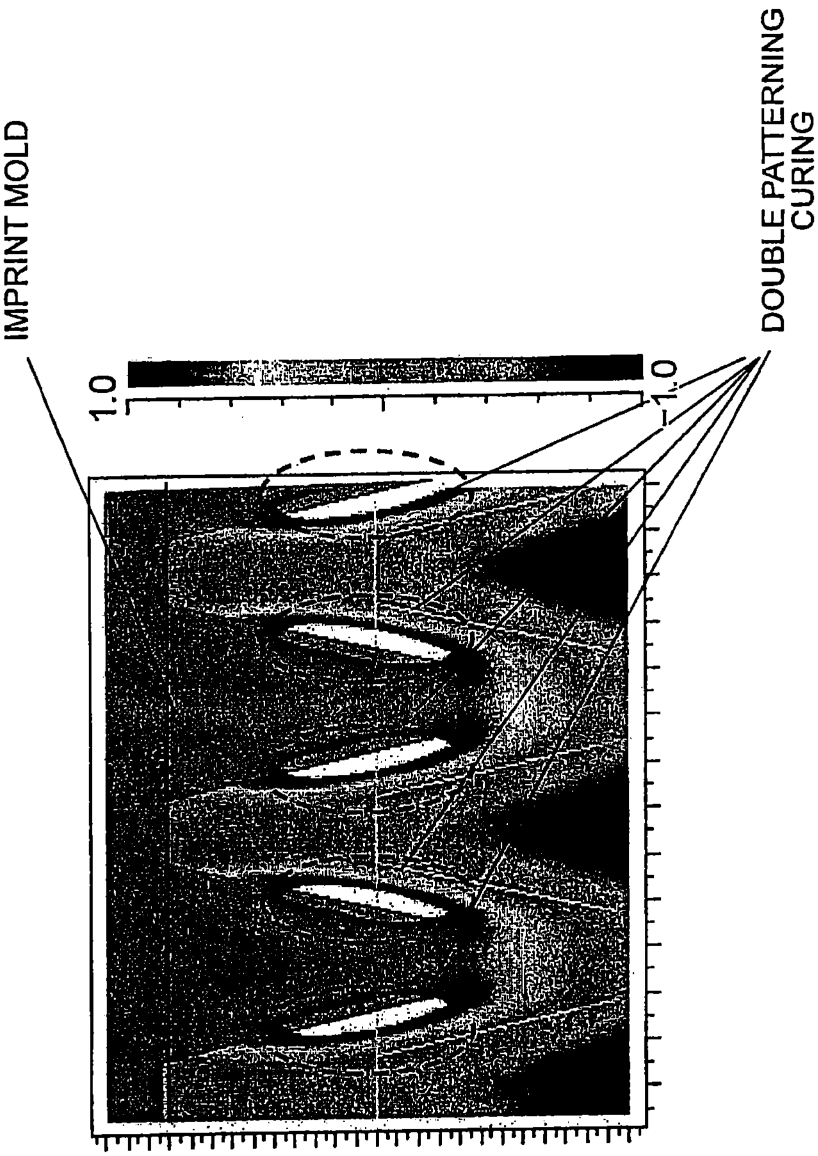
FIG. 18 is a photograph showing the near-field light generated at the edge portions in a pattern by the method according to the eleventh embodiment.

FIG. 18 shows a photograph indicating that near-field light is generated at the concave and convex edge portions that correspond to the pattern 94 of the template 90. As can be seen from FIG. 18, the light intensity of the near-field light is higher at the concave and convex edge portions. The light-curable resin film 82 reacts to the generated near-field light. As a result, the light-curable resin film 82 is cured at local regions 82*a* corresponding to the above-mentioned edge portions, as shown in FIG. 17A.

As shown in FIG. 17B, the template 90 is detached from the Si substrate 80. The edge neighborhood portions 82*a* formed by curing the light-curable resin film 82 with the near-field light generated in the step illustrated in FIG. 16E adhere tightly to the template 90. Therefore, the cured light-curable resin film portions 82*a* are detached, together with the template 90, from the Si substrate 80. On the other hand, the light-curable resin film portions 82*b* that do not have near-field light generated and are located outside the edge neighborhood portions 82*a* are not cured and are soft in the steps illustrated in FIGS. 16A through 16E. Therefore, the portions 82*b* are not detached with the template, but remain on the Si substrate 80 (FIG. 17B).

The light-curable resin film portions 82*b* remaining on the Si substrate 80 is used as a mask, and etching is performed on the Si substrate 80. In this manner, a silicon substrate 80*a* having a fine pattern can be obtained.

The near-field light generating film pattern 94 of the template 90 is made of a metal containing at least one element selected from the group consisting of Au, Al, Ag, Cu, and Cr, and the film thickness of the pattern 94 may be greater than 0 nm and not greater than 40 nm. The light to be emitted can have a wavelength of 1 μm to 5.0 μm. Further, light can be emitted onto the template 90. The light-curable resin film 82 can not be cured by light having a wavelength of 1 μm to 5.0 μm.

As shown in FIG. 18, the concave edge portions of the concave-convex mold serve as an even finer pattern. That is, by the nanoimprint method to which this embodiment is applied, the light-curable resin film can be locally cured by near-field light rapidly enhanced at the concave and convex edge portions, to form a sharp detachment face at the time of detachment. In this manner, a much finer pattern than a pattern formed with concavities and convexities can be formed. At the concave and convex edge portions, sharper electrical field gradients exist, depending on emitted light. However, a diabatic process that reacts only in those regions can be used. Accordingly, fine patterning of 10 nm or smaller can be performed with high precision.

FIG. 19 shows template materials, substrate materials, the wavelengths of injection light sources, and the wavelengths of light-curable resins that are used in Examples 1 through 8 according to this embodiment. FIG. 20 shows template materials, substrate materials, the wavelengths of injection light sources, and the wavelengths of light-curable resins that are used in Comparative Examples 1 through 4 of this embodiment. In FIGS. 19 and 20, the template materials are the materials for the substrate 92 of the template 90, and the substrate materials are the materials for the substrate 80 on the side to be exposed. The template materials and the substrate materials are Si or glass. In FIGS. 19 and 20, double circles indicate "very good", single circles indicate "good", and triangles indicate "not very good."

As described above, according to the eleventh embodiment, a pattern is transferred by combining a nanoimprint method and a near-field exposure method. Accordingly, a fine pattern can be formed.

Twelfth Embodiment

Figure 21:
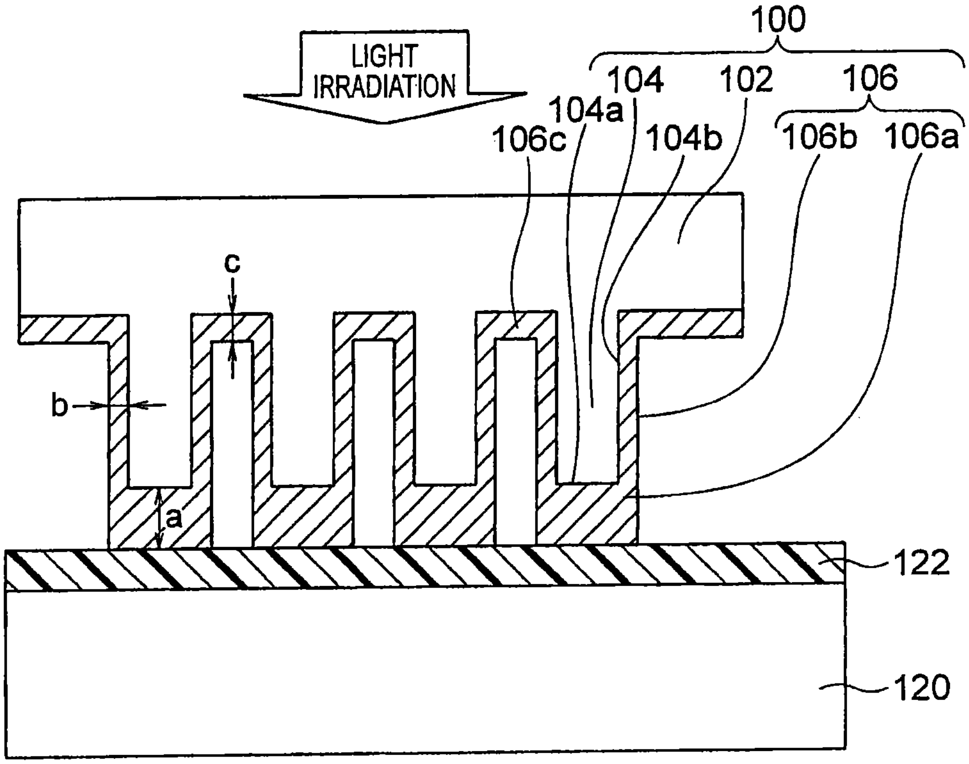
FIG. 21 is a cross-sectional view for explaining a near-field optical lithography method according to a twelfth embodiment.
Figure 22A:
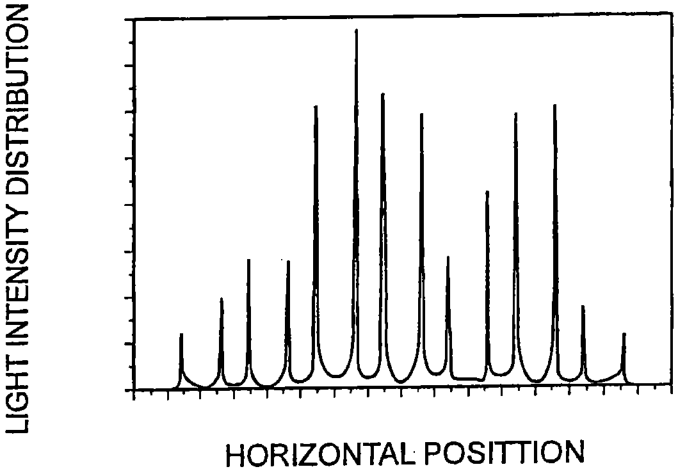
FIGS. 22A through 22D are graphs showing the distributions of light intensities of samples 1 through 4.
Figure 22B:
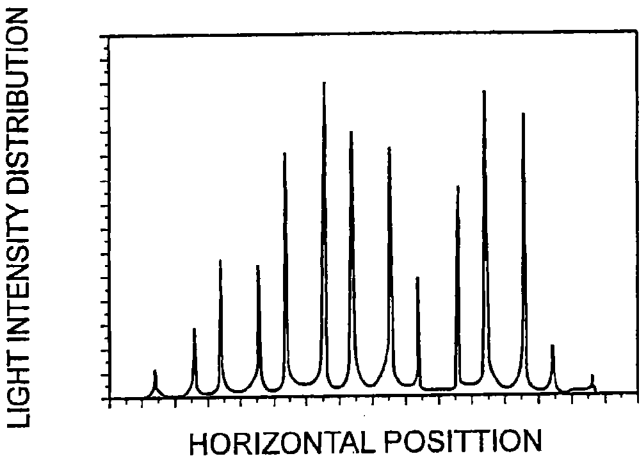
Figure 22C:
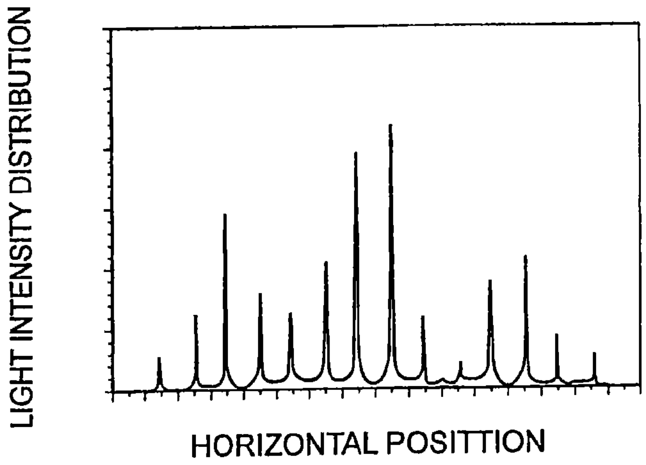
Figure 22D:
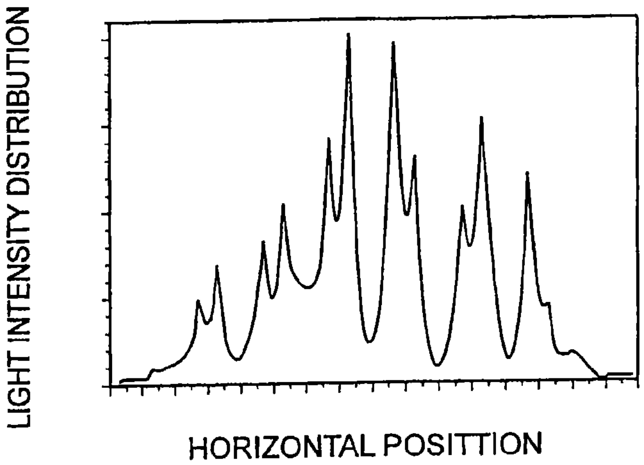

Referring now to FIG. 21, a near-field optical lithography method according to a twelfth embodiment is described.

A near-field exposure method and a near-field optical nanoimprint method are lithography techniques involving near-field light generating members as masks or templates, and are designed for generating near-field light from light having a longer wavelength than the wavelength of propagating light that is normally emitted. It is known that, with the use of near-field light, a photochemical reaction occurs in the resist at a shorter wavelength at which a reaction does not normally occurs. Accordingly, no reactions occur at portions irradiated only with propagating light from which near-field light is not generated, but a photochemical reaction occurs only at the portions where near-field light exists, to enable patterning. This is a phenomenon that occurs both in the case of a near-field exposure method and in the case of a near-field optical nanoimprint method.

Near-field light with high intensity is focused locally onto portions with small radii of curvature in the surface. That is, the electrical field intensity of near-field light tends to become higher at portions near the corners. Therefore, in a light exposure using nanoimprint or a mask, patterning is performed depending on the line shapes of the mask or a template. However, if an exposure or imprint curing occurs only at both sides of the mask in the mask width direction, the patterned linewidth becomes smaller by half or more, and the number of lines is doubled. That is, with the use of near-field light, finer patterning can be performed.

By the near-field optical lithography method according to the twelfth embodiment, the near-field light generating member 100 illustrated in FIG. 21 is used as a near-field exposure mask or a template. In the near-field light generating member 100, at least one convex portion 104 is formed on one of the facing surfaces of a transparent substrate 102. The substrate 102 and the convex portion 104 can be made of different materials from each other, or may be made of the same material. Examples of materials of the respective substrates include Si, $SiO_2$, sapphire, magnesium fluoride, zinc sulfide, zinc selenide, and calcium fluoride. The convex portion 104 includes a top end 104*a* and sides 104*b*. The sides 104*b* are side faces that connect the top end 104*a* and the substrate 102. The top end 104*a* and the sides 104*b* are covered with a near-field light generating layer 106 that is made of metal, CNT (carbon nanotube), or graphene. Specifically, the near-field light generating layer 106 includes a first layer 106*a* covering the top end 104*a* of the convex portion 104, and a second layer 106*b* covering the sides 104*b* of the convex portion 104. Further, a third layer 106*c* made of metal, CNT (carbon nanotube), or graphene can be or may not be formed in the region other than the convex portion 104 on the surface of the substrate 102 on which the convex portion 104 is formed.

The near-field light generating member 100 is positioned so that a substrate 120 on which a photosensitive resin layer (a resist layer) 122 is formed, and the photosensitive resin layer 122 face the convex portion 104. In this situation, light is emitted onto the back surface of the near-field light generating member 100, or onto the surface on the opposite side from the surface on which the convex portion 104 is formed. In this manner, near-field light is generated from the near-field light generating layer 106, and the photosensitive resin layer 122 is exposed by the near-field light. If the substrate 120 is a transparent substrate, light can be emitted onto the substrate 120.

Metal, CNT (carbon nanotube), and graphene has the function to generate and guide near-field light. Near-field light generated by any of those materials has excellent polarization components in the traveling direction (the direction from the substrate toward the top end of the convex portion in the side faces of the convex portion) or has excellent so-called z-polarized light (light polarized in the traveling direction), compared with the polarization components of general plane wave propagation light that are perpendicular to the traveling direction. Therefore, the near-field light is suitable for the use in the lithography technology, and has double patterning properties. Accordingly, stronger double patterning can be performed, if a resist formed by the lithography technology or the polymerization initiator of a curable resin in a nanoimprint method strongly reacts to z-polarized light.

Further, by reducing the width of the convex portion, fine patterning, if not double patterning, can be performed.

Example 1

Examples 1 through 4 in which the film thicknesses of the respective components in the near-field light generating layers 106 were varied were prepared as near-field light generating members 100. Cr was used as the material of the near-field light generating layers 106. Light of 532 nm in wavelength was emitted onto each substrate 102, and the light intensity distributions in the convex portions 104 of the near-field light generating members 100 were examined with a near-field optical microscope. Each convex portion 104 was a line-and-space structure of 100 nm/100 nm, and the height of each convex portion 104 was 450 nm. The light intensity distributions do not depend on the sizes of line-and-space structures and the heights of convex portions.

The results of the examination are shown in Table 1 (shown below) and FIGS. 22A through 22D. In Table 1, "a," "b," and "c" represent the film thicknesses of the first layer 106*a*, the second layer 106*b*, and the third layer 106*c* of each near-field light generating layer 106. FIGS. 22A through 22D are graphs showing the light intensity distributions in the samples 1 through 4.

To have almost equal intervals between the lines formed by double patterning, the width of the convex portion 104 of each near-field light generating member 100 should be almost a half a space interval.

TABLE 1

| | a | b | c | EVALUATION |
|---|---|---|---|---|
| SAMPLE 1 | 50 nm | 10 nm | 50 nm | good |
| SAMPLE 2 | 50 nm | 10 nm | 0 nm | excellent |
| SAMPLE 3 | 20 nm | 5 nm | 0 nm | very good |
| SAMPLE 4 | 100 nm | 20 nm | 0 nm | not good |

Double patterning was not properly performed in the sample 4, but was performed in the samples 1 through 3. The peak intensity ratios among the respective double-patterned structures were 8:27:22:2 (sample 1:sample 2:sample 3:sample 4). Therefore, the samples 2 and 3 were preferable, and the sample 2 was particularly preferable. This is because the near-field light generated at the sides 104*b* was guided toward the top end 104*a*, and reached the corners of the top end 104*a*, to enhance the optical electric-field at the corners. A simulation was performed on the same structures as above by the FDTD (Finite-Difference Time-Domain) method. As a result, z-polarization components, or particularly the electric fields at the corner portions, were enhanced. Therefore, if the resist in lithography or the polymerization initiator of the curable resin in nanoimprint strongly reacts to z-polarized light, stronger double patterning can be performed. By spin coating, the resin main chain is readily oriented in the in-plane direction or particularly in the radial direction of motion (the direction from the center to the outside). Accordingly, the above characteristics can be achieved by appropriately modifying the resist resin structure.

With the samples 1 through 4 being used as masks, the to-be-exposed substrate 120 having the resist 122 applied thereonto was placed on the light shielding side of the near-field exposure mask 100, as shown in FIG. 21. Exposures were then performed. Examples of positive resists that can be used here include a diazonaphthoquinone-novolac resist and a chemically-amplified positive resist. Examples of negative resists that can be used include a chemically-amplified negative resist, a photo cation polymerizable resist, a photo radical polymerizable resist, a polyhydroxystyrene-bisazide resist, a cyclized rubber-bisazide resist, and a polyvinyl cinnamate resist. Exposures were performed on those resists, and the obtained clear double-patterned shapes were evaluated as shown in Table 1.

In the case of line patterning, the polarized light to be emitted is preferably p-polarized light. In this case, p-polarized light is polarized light having the electrical field of the light irradiation in a direction perpendicular to the pattern length direction.

Other than Cr, the following metals can be used: Au, Al, Ag, Cu, Cr, Sb, W, Ni, In, Ge, Sn, Pb, Zn, and Pd. Where a graphene film, instead of a metal film, was formed, double patterning was also performed. Where a carbon nanotube film was formed, the effects of double patterning were also confirmed.

Example 2

The parameter ranges in which double patterning was possible in Example 1 were examined. The results showed that "a" was 15 to 80 nm, "b" was 2 nm to 20 nm, and "c" was 0 nm to 80 nm. Where "a" was greater than "c," and "b" was greater than "c," clearer double-patterned structures were observed. If the third layer 106*c* exists or is thick, the intensity of the near-field light generated in the side faces becomes lower. This is because light is absorbed in the third layer 106*c* prior to generation of near-field light, and becomes weaker. Further, a better result was achieved where "a" was greater than "b." This is because the near-field light inside the convex portion 104 and the near field light outside the convex portion 104 can be both used, if the film thickness of each side face is smaller than the film thickness of the top end.

Figure 23A:
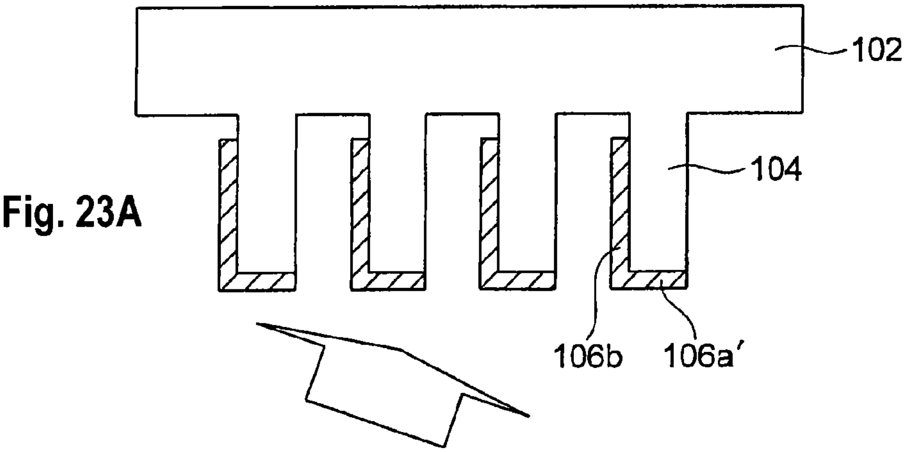
FIGS. 23A and 23B are diagrams for explaining formation of a near-field light generating layer.
Figure 23B:
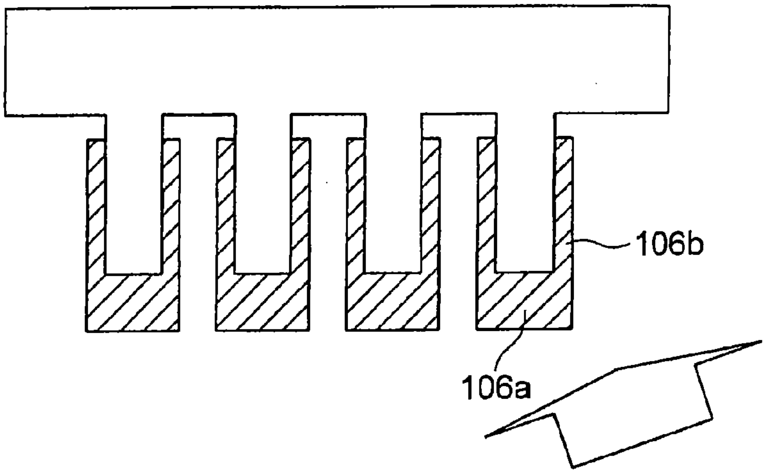

To perform film formation under the above described conditions, the source direction is set in diagonal directions, and film formation is performed from the two directions, as shown in FIGS. 23A and 23B. The film forming method is normally a vapor deposition method, a sputtering method, or MBE, but is not limited to those methods. By adjusting the angle of irradiation from the irradiation source, the film thicknesses and film thickness ratios of the first layer 106*a*, the second layer 106*b*, and the third layer 106*c* can be adjusted.

Example 3

The near-field light generating members 100 of the samples 1 through 4 used in Example 1 were used as nanoimprint templates, and imprint lithography was performed. In the UV-curable resin, acrylic ester was used as the matrix, and benzophenone, thioxanthone, or 2,4 diethylthioxanthone was used as the polymerization initiator. However, the matrix and the polymerization initiator are not limited to those materials. The precursor solution for the UV-curable resin was applied to the substrate, and a glass plate of 5 cm in thickness was placed as a weight on the template, to press the template against the substrate. The irradiation light was light of 488 nm, instead of a ultraviolet ray. After the irradiation, the template was detached from the substrate, and the unsolidified precursor solution was removed. As a result, a double-patterned shape was confirmed.

Example 4

The parameter ranges in which double patterning was possible in Example 3 were examined. The results showed that "a" was 15 nm to 80 nm, "b" was 2 nm to 20 nm, and "c" was 0 nm to 80 nm. Where "a" was greater than "c," and "b" was greater than "c," clearer double-patterned structures were observed. Even clearer double-patterned structures were achieved where "a" was greater than "b."

As described above, according to the twelfth embodiment, double patterning can be efficiently performed by a near-field exposure method using a resist or a nanoimprint method, and the processing accuracy for masks and templates can be increased.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A pattern forming method, comprising:

pressing a template against a second substrate having a light-curable resin applied to a surface thereof, the template including a transparent first substrate and a near-field light generating unit that is formed on the first substrate, the near-field light generating unit being a layer containing at least one element selected from the group consisting of Au, Al, Ag, Cu, Cr, Sb, W, Ni, In, Ge, Sn, Pb, Zn, Pd, and C, or a film stack formed with layers made of some of those materials;

injecting light to a side of the first substrate, the light having a wavelength of 1 μm to 5 μm; and causing the light-curable resin to react to near-field light generated from the near-field light generating unit, the near-field light being generated by the injected light.

2. The method according to claim 1, wherein the near-field light generating unit includes a concave-convex pattern.

3. The method according to claim 1, wherein the light-curable resin does not react to the light having the wavelength of 1 μm to 5 μm.

4. A near-field optical lithography member comprising:

a transparent substrate;

a convex portion formed on one of surfaces of the substrate; and a near-field light generating layer that covers a top end of the convex portion and sides of the convex portion, the sides connecting the top end and the substrate, the near-field light generating layer being made of Au, Al, Ag, Cu, Cr, Sb, W, Ni, In, Ge, Sn, Pb, Zn, Pd, or C.

5. The member according to claim 4, wherein a film thickness of a portion of the near-field light generating layer covering the top end of the convex portion is greater than a film thickness of each portion of the near-field light generating layer covering the sides of the convex portion.

6. The member according to claim 4, wherein the near-field light generating layer is also formed on a region of the one of the surfaces of the substrate other than the convex portion, and a film thickness of each portion of the near-field light generating layer covering the top end and the sides of the convex portion is greater than a film thickness of a portion of the near-field light generating layer formed on a region of the one of the surface of the substrate other than the convex portion.

7. The member according to claim 4, wherein the substrate is made of a material different from a material of the convex portion.

8. The member according to claim 4, wherein a thickness of a portion of the near-field light generating layer covering the top end of the convex portion is 15 nm to 80 nm, and a thickness of each portion of the near-field light generating layer covering the sides is 2 nm to 20 nm.

9. A near-field exposure method, comprising performing a near-field exposure, using the near-field optical lithography member of claim 4 as a near-field exposure mask.

10. A near-field nanoimprint method, comprising performing near-field nanoimprint, using the near-field optical lithography member of claim 4 as a near-field nanoimprint template.

* * * * *